United States Patent [19]
Majors

[11] Patent Number: 5,581,475
[45] Date of Patent: Dec. 3, 1996

[54] METHOD FOR INTERACTIVELY TAILORING TOPOGRAPHY OF INTEGRATED CIRCUIT LAYOUT IN ACCORDANCE WITH ELECTROMIGRATION MODEL-BASED MINIMUM WIDTH METAL AND CONTACT/VIA RULES

[75] Inventor: Steven S. Majors, Palm Bay, Fla.

[73] Assignee: Harris Corporation, Melbourne, Fla.

[21] Appl. No.: 106,251

[22] Filed: Aug. 13, 1993

[51] Int. Cl.$^6$ .................................................. G06F 17/50
[52] U.S. Cl. .......................... 364/491; 364/488; 364/490; 364/489
[58] Field of Search .................................. 364/488–491, 364/578; 371/22.1, 23, 29.1; 307/440, 465.1, 482.1

[56] References Cited

U.S. PATENT DOCUMENTS

| | | | |
|---|---|---|---|
| 4,827,428 | 5/1989 | Dunlop et al. | 364/491 |
| 5,050,091 | 9/1991 | Rubin | 364/488 |
| 5,062,054 | 10/1991 | Kawakami et al. | 364/491 |
| 5,150,308 | 9/1992 | Hooper et al. | 364/489 |
| 5,202,841 | 4/1993 | Tani | 364/491 |
| 5,202,889 | 4/1993 | Aharon et al. | 371/27 |
| 5,349,542 | 9/1994 | Brasen et al. | 364/578 |
| 5,404,310 | 4/1995 | Mitsuhashi | 364/490 |
| 5,410,490 | 4/1995 | Yastron | 364/488 |

FOREIGN PATENT DOCUMENTS

| | | | |
|---|---|---|---|
| 0204178A2 | 5/1986 | European Pat. Off. | G06F 15/60 |
| 0599469A2 | 10/1993 | European Pat. Off. | G06F 15/60 |

OTHER PUBLICATIONS

Beitman et al., "Generation of Electromigration Ground Rules Utilizing Monte Carlo Simulation Methods", *IEEE Trans. Semicond. Mfg.*, vol. 4 No 1, Feb. 1991, pp. 63–66.

Dunkley et al., "A Systems Approach to Electromigration Prevention in Bipolar IC's", *IEEE 1988 Bipolar Circuits & Technology Meeting*, Paper 10.4.

Dutta et al., "Automatic Sizing of Power/Ground (P/G) Networks in VLSI", *26th ACM/IEEE Design Automation Conference*, 1989, pp. 783–786.

Fu, "An Analytical Model For Linewidth–Dependent Electromigration Lifetime in VLSI Interconnects", *1990 Symposium on VLSI Technology*, pp. 29–30.

Liew et al., "Circuit Reliability Simulator For Interconnect, Via, and Contact Electromigration", *IEEE Trans. on Electron Devices*, vol. 39, No 11, Nov. 1992, pp. 2472–2479.

Rozenblit et al., "Towards a VLSI Packaging Design Support Environment (PDSE); Concepts and Implentation", *1990 IEEE Internat'l Conf. on Computer Design*, pp. 443–448.

IEEE Transactions on Computer–aided Design, Vol cad–6, No. 6 Nov., 1987, (USA), pp. 1023–1031, Hall J etal, "Spider–a CAD System etc".

Primary Examiner—Kevin J. Teska
Assistant Examiner—Leigh Marie Garbowski
Attorney, Agent, or Firm—Charles E. Wands

[57] ABSTRACT

An interactive electromigration rule-based topography layout adjustment methodology is provided as an adjunct to a computer aided design tool, in particular a design rule check (DRC) mechanism, the engine for which is served by a design rule database for defining topography parameters that conform with a given semiconductor wafer fabrication process. Using a set of customized design rule statements, the DRC program is able to provide circuit designer with the ability to identify and interactively change, as necessary, dimensions of those portions of branches of interconnect (metal, contacts, vias) within the topography of an integrated circuit layout, the customized DRC statements being customized in accordance with circuit operation-derived worst case current conditions as applied to a prescribed set of electromigration-based minimum width rules for interconnect metal, contacts and vias.

25 Claims, 19 Drawing Sheets

```
relDefineEmMetalRules(
    ?material        "Metal_1"
    ?layer           "Met1"
    ?cutLayer        "fm0"
    ?labelLayer      "fm1"
    ?minGrid         0.5
    ?Beta            2.0e15
    ?M               1.0
    ?N               2.0
    ?Ea              0.665
    ?Sigma           0.6
    ?Wdelta          0.0
    ?Wsigma          0.25
    ?Win             6.0
    ?T               0.6
    ?Tsigma          0.01
    ?Jmax            5e5
    ?stepCoverage    0.5
)
relDefineEmMetalRules(
    ?material        "Metal_2"
    ?layer           "Met2"
    ?cutLayer        "fm8"
    ?labelLayer      "fm2"
    ?minGrid         0.5
    ?Beta            4.066e10
    ?M               0.29
    ?N               2.0
    ?Ea              0.49
    ?Sigma           0.5
    ?Wdelta          1.35
    ?Wsigma          0.62
    ?Win             10.0
    ?T               1.4
    ?Tsigma          0.037
    ?Jmax            2e5
    ?stepCoverage    0.5
)
relDefineEmcontactRules(
    ?material        "Contact"
    ?layer           "Aps"
    ?metalLayers     "Met1"
    ?minGrid         0.5
    ?OVLmin          3.0
    ?Wmin            5.0
    ?lum_150         0.55
    ?lum_175         0.33
)
relDefineEmcontactRules(
    ?material        "Via"
    ?layer           "Via"
    ?metalLayers     list("Met2" "Met1")
    ?minGrid         0.5
    ?OVLmin          5.0
    ?Wmin            4.0
    ?lum_150         0.54
    ?lum_175         0.37
```

FIG. 9

SAMPLE DRC ROUTINE

```
compositeMet1=or(Met1);
cutMet1=compositeMet1 andnot fm0;
compositeMet2=or(Met2);
cutMet2=compositeMet2 andnot fm8;

compositeVia=or(Via);
trueVia=compositeVia and cutMet2 and cutMet1;
contVia=or trueVia;
compositeAps=or(Aps);
trueAps=compositeAps and cutMet1;
contAps=or trueAps;

label cutMet1 by fm1;
label cutMet2 by fm2;

connect cutMet2, cutMet1, trueVia by contVia;
connect cutMet1, trueAps by contAps;

emMet1=get_net(cutMet1,"emCheck");
emMet2=get_net(cutMet2,"emCheck");

emVia=get_net(trueVia,"emCheck");
emAps=get_net(trueAps,"emCheck");

OVLmet=drc(emMet2,emVia, 0<ext<=10, opposite);
OVLgap=drc(emVia, sep<=10, opposite);
OVLedge=grow(emVia, .5, edges);
OVL=OVLmet or OVLgap) enclosing OVLedge;
OVLcut=emMet2 andnot OVL;
plot(get_edge(emVia inside OVLcut), "cm_ViaEdge");
plot(OVL, "cm_ViaOverlap");
plot(grow(emVia, 5), "cm_ViaRegion");
plot(compositeVia enclosing emVia, "cm_ViaContact");

OVLmet=drc(emMet1,emAps, 0<ext<=6, opposite);
OVLgap=drc(emAps, sep<=6, opposite);
OVLedge=grow(emAps, .5, edges);
OVL=(OVLmet or OVLgap) enclosing OVLedge;
OVLcut=emMet1 andnot OVL;
plot(get_edge(emAps inside OVLcut),"cm_ApsEdge")
plot(OVL, "cm_ApsOverlap");
plot(grow(emAps, 3),"cm_ApsRegion");
plot(compositeAps enclosing emAps, "cm_ApsContact");

plot(or drc(get_edge(emMet1 outside fm0), width<14.5),
   "Metal1:Minimum width due to electromigration is 14.5");
plot(or drc(get_edge(emMet2 outside fm8), width<31),
   "Metal2: Minimum width due to electromigration is 31");
```

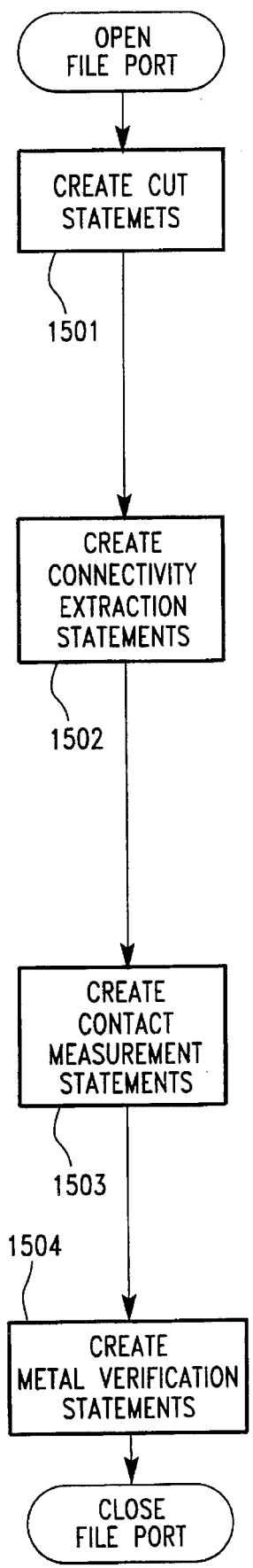

FIG. 15

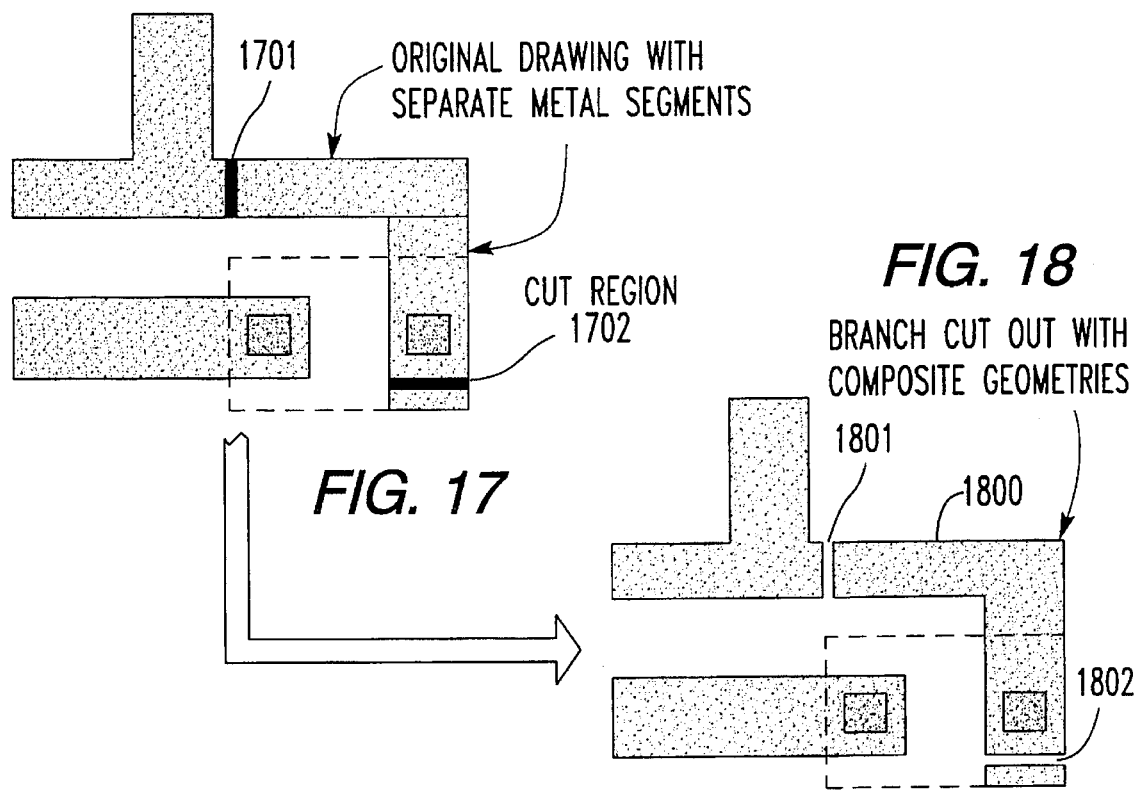
FIG. 17
1701 — ORIGINAL DRAWING WITH SEPARATE METAL SEGMENTS
CUT REGION 1702
FIG. 18
BRANCH CUT OUT WITH COMPOSITE GEOMETRIES
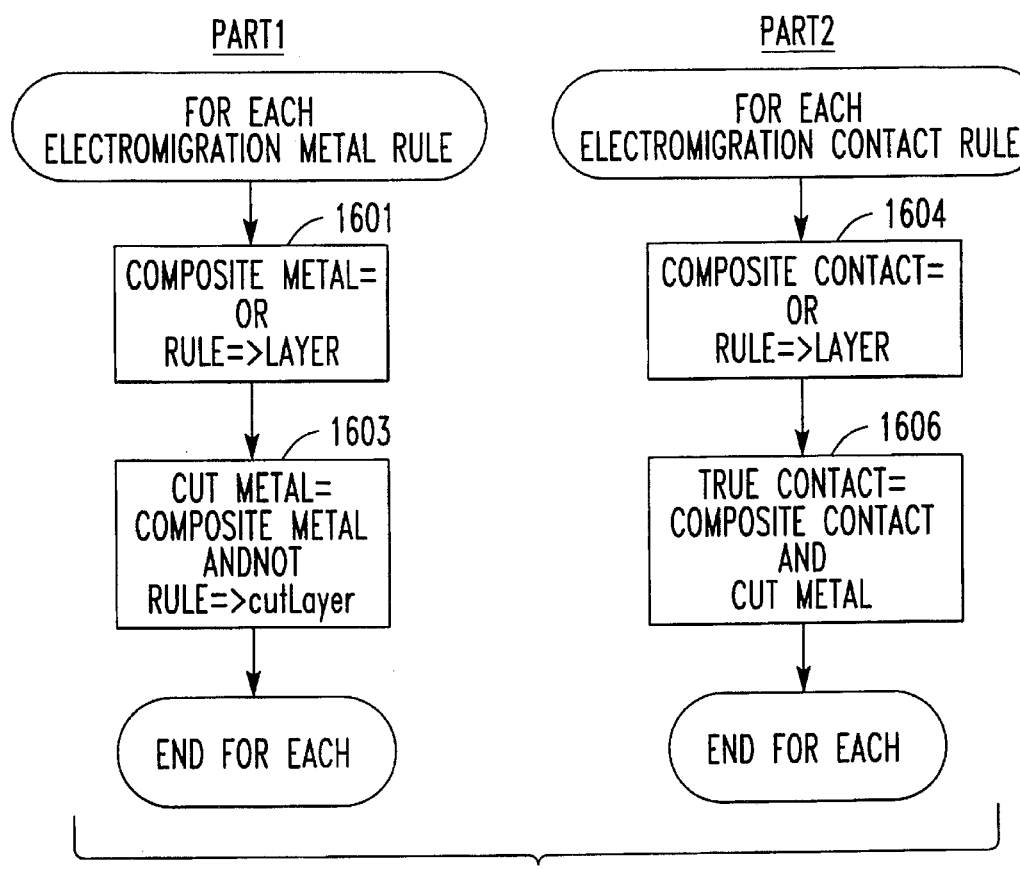
FIG. 16

METHOD FOR INTERACTIVELY TAILORING TOPOGRAPHY OF INTEGRATED CIRCUIT LAYOUT IN ACCORDANCE WITH ELECTROMIGRATION MODEL-BASED MINIMUM WIDTH METAL AND CONTACT/VIA RULES

FIELD OF THE INVENTION

The present invention relates in general to the manufacture of integrated circuit architectures and is particularly directed to a methodology for interactively adjusting, as necessary, the dimensions of one or more portions of branches of interconnect within the topography of an integrated circuit layout, that have been tentatively identified as requiring greater than minimum width dimensions, using a design rule check program, a set of measurement statements for which have been customized in accordance with circuit operation-derived worst case current conditions as applied to a prescribed set of electromigration models for interconnect metal, contacts and vias.

BACKGROUND OF THE INVENTION

Continuing improvements in semiconductor processing techniques employed for the layout and fabrication of integrated circuits have resulted in a substantial increase in the density and complexity of building blocks (both custom and non-application specific components) available to the analog and mixed (digital/analog) signal processing system designer. Indeed, chip architectures may employ hundreds of thousands of circuits to implement a prescribed signal processing function.

Now although semiconductor manufacturing processing parameters allow the interconnect material (metal, contacts, vias), through which signal and circuit element bias paths are provided among respective components of a given architecture, to be fabricated with extremely narrow line widths and thereby ostensibly realize a very compact circuit layout, performance factors and not merely density, per se, must be taken into consideration before a given design may be 'reduced to silicon'.

A significant influence in mean time to failure (MTF), or over what length of time a circuit will satisfactorily perform its intended signal processing function is an undesirable, but unavoidable, effect called electromigration, which causes the original physical characteristics of a given interconnect topography to be altered in the course of operation of the circuit due to current flow through metal, vias and contacts. Specifically, electromigration is a physical phenomenon whereby, during circuit operation, metal atoms are pushed by the conducting electrons in the direction of current flow. Any divergence in the directed mass flux causes physical discontinuities in the metal that eventually leads to failure of the circuit.

Electromigration typically manifests itself in the form of hillocks, whiskers and voids in the metallic conductive material. Because electromigration is a natural consequence of current flow through metal over time, it must be taken into account as a priority consideration before a given circuit design is fabricated; in fact, MTF for electromigration can be predicted as a function of current density and temperature.

Using well developed electromigration models (respectively associated with metallic line, contact and via material), which limit the width of interconnect as a function of maximum current flow and temperature, circuit designers usually invest a significant amount of time identifying and verifying those portions of a circuit architecture that must have a dimension (line width) that is greater than a deterministically prescribed minimum width. Because this process is labor intensive it is error prone and is often not invoked until the end of the product development cycle, which undesirably delays completion of the circuit layout.

SUMMARY OF THE INVENTION

In accordance with the present invention, there is provided a new and improved 'automated' electromigration rule-based methodology, which provides the circuit designer with the ability to prepare a customized design rule check mechanism to identify and interactively adjust, as necessary, the dimensions of respective portions of branches of interconnect within the topography of an integrated circuit layout, so that, upon completion of the design phase of the development sequence, the circuit may be readily fabricated.

More particularly, the present invention is directed to what is effectively an adjunct to a conventional computer aided design tool, in particular a design rule check (DRC) mechanism, the engine for which is served by a design rule database for defining topography parameters that conform with a given semiconductor wafer fabrication process. The present invention provides the circuit designer with the ability to identify and interactively modify, as necessary, dimensions of those portions of branches of interconnect (metal, contacts, vias) within the topography of an integrated circuit layout, by means of a design rule check operator that has been customized in accordance with circuit operation-derived worst case current conditions as applied to a prescribed set of electromigration-based minimum width rules for interconnect metal, contacts and vias.

Preliminary to determining whether any portion of a given circuit topography layout requires a dimensional change, worst case currents flowing through respective branches of the circuit are determined, using successive runs of a standard circuit simulation routine under varying operating conditions. For each simulation run, the worst case currents obtained for each branch and component in the circuit are stored. After a number of simulation runs under varying sets of circuit operating conditions, the values of the stored worst case currents are updated, so that, at the end of the simulation sequence, a set of largest magnitude worst case currents for the circuit design of interest is provided.

The largest worst case operational currents that have been derived and stored as a result of the simulation sequence are compared with maximum design currents for the circuit. For each path, the larger current is identified as the maximum operating current (Imax) to be used in generating a set of customized statements for executing a design rule check program. These current values Imax and associated minimum device geometries Wmin necessary to support such currents are also back-annotated on the CAD tool's circuit schematic.

Once the worst case currents Imax have been specified, the invention interactively examines a respectively defined branch of a given integrated circuit layout design and determines whether any portion of that branch requires a dimensional change, in order to satisfy minimum width requirements based upon electromigration models for respective metal, contact and via materials. The process is interactive in that it responds to inputs supplied by the layout designer and highlights, on an attendant graphical display device employed by the layout designer's CAD tool, in order to define the topography of the circuit, where dimensional changes are necessary.

In accordance with a first step in the process, the physical topography of a branch of the circuit layout, as specified by the user, is precisely delimited, and the maximum current through that branch topography is derived from the maximum current (Imax) data that has been obtained. Selection of a circuit layout branch initially involves designating respective locations at opposite ends of the branch of interest. These end points demarcate end boundaries of the branch, and also establish cut regions that enable the branch to be separated from the remainder of the interconnect material, so that an accurate electromigration analysis of the branch based upon only the maximum current associated with that branch, exclusive of other branches which intersect that branch, may be carried out.

When the user selects an end point, then from an associated electromigration rule parameter database employed by the CAD tool program, the routine identifies material directly beneath the coordinates of the end point and defines a 'data' layer as comprising this material, such as a first layer of metal (or M1). All interconnect materials or objects that overlap or abut one another in the vicinity of the selected end point are effectively 'flattened' and merged together on the graphics display, so as to form a displayed continuum of (M1) interconnect material at that point. The electromigration rule that is associated with the interconnect material that has been denoted as the data layer beneath the end point is then obtained.

Since design rule check programs customarily require a region having a definable area in order to execute its various routines, then in order to sever portions of interconnect from one another, the process creates a 'cut region' at the end point of interest. The coordinates of the boundaries of the cut region may be established in accordance with the following process flow routine.

First, a point inside the interconnect branch, or merged polygon geometry, where a cut is to be made is selected. Next, the respective perimeter edges of the interconnect branch are identified in terms of their spatial geometry coordinates at the ends of each edge. Then, one of the edges of the polygon that is adjacent to the selected point is specified. By 'adjacent' is meant a polygon edge a line normal to and from which passes through the selected point without first intersecting another polygon edge. The selected point is projected along a line perpendicular to the specified polygon edge, and the projected distance between the coordinates of the selected point and the edge is determined. This process is carried out for all edges adjacent to the selected point.

For the projected distance having the lowest value, indicating that the polygon edge of interest is the edge closest to the selected point, the coordinates of the intersection of the projection line and the polygon edge are saved. The routine then proceeds to find the next closest adjacent edge. A first line segment is then drawn between the two sets of coordinates. In addition, a second line segment is drawn parallel to the first line segment and intersecting the polygon edges. The second line segment is defined so as to be spaced apart from the first line segment by some prescribed nominal number of graphical numerical units, for the purpose of defining a narrow strip region used by the CAD program to draw a nominal portion of metal to be cut away from the interconnect and thereby sever the interconnect into two spaced apart portions at that point. This 'cut' region is drawn on that layer specified in the list of parameters of the associated electromigration rule (e.g. a parameter list for metal M1). For an end point, the effect will be to sever one end of the branch from adjacent metal.

At the completion of the cut region sub-routine, the process determines whether both ends of the branch have been defined. If not, the user defines the second end point of the branch and the foregoing sequence of steps is carried out for the second end point. Once a second cut region has been drawn on the interconnect layout branch, the user selects an arbitrary point on the branch between the end points (inside the branch). The type of interconnect material directly beneath that point is identified as and the electromigration rule associated with that identified data layer is specified. From the associated parameter list a label "emCheck" is created for a 'labelLayer'. the label "emCheck" is used as a generic term to identify the composite set of materials of which the branch is formed.

The process next sets the maximum current through the branch. In order to determine the maximum branch current it is necessary to take into account currents flowing into the branch via all paths that feed the branch, and includes summing the currents that enter a respective branch from whatever the entry points to the branch, including currents specified from the operational schematic and currents not specified for a respective branch entry point. For a respective branch of the circuit topography a sub-routine is employed which examines every path by way of which a current is supplied and accumulates or sums the path currents, as necessary to derive the total current through the branch. Since the precursor maximum current simulation only provides currents through devices in the respective paths between circuit nodes, the process looks at paths, not currents through or into devices.

Once a respective branch has been defined and its maximum current Imax determined, the methodology of the present invention proceeds to compile a set of customized Design Rule Check (DRC) statements to be applied to the DRC program. The customized DRC is compiled in accordance with the physical topography of the defined branch and the maximum current through the branch, and the electromigration rules for respective interconnect materials comprising the branch. During the customized DRC statement compilation routine, the path of current flow and electromigration-specific measurement parameters that simplify adjustment of dimensions of one or more portions of the branch topography are determined.

The first step in the customized DRC compilation routine is to create DRC 'cut' statements, through the execution of which the branch is severed or 'cut' from the remainder of the interconnect topography. As already noted, end points of the branch are employed to demarcate nominally thin cut regions at the severance points. The cut statements are generated to define executable instructions which the DRC program uses to cut the branch away from the remainder of the interconnect topography.

Respective sub-routines are employed for generating cut statements for both metal and for identifying all contact material that resides within the branch of interest. In the metal sub-routine, all of the metal of the branch is assembled into a composite metal continuum by logically combining (ORing) all the metals in the electromigration parameter listings that correspond to that 'layer'. 'Cut metal', i.e. the intended branch, is defined as that portion of the composite metal resulting from a logical (Boolean) 'ANDNOT' operation on the composite metal with that portion of the interconnect metal corresponding to the identity 'cutLayer' in the rule set parameter list. Namely, the ANDNOT operation serves to exclude from the composite metal layer the cut regions of the sub-routine. What remains is a region of 'cut metal' i.e. the intended branch severed from the remainder interconnect metal.

A contact subroutine is then executed to identify all of the contact material that lies within the confines of the 'cut metal' (severed branch), and excludes contact material lying outside the branch. For this purpose, all of the contact material of a respective layer is combined into 'composite contact' material by logically combining (ORing) those contact materials in the electromigration rule parameter listings that correspond to the parameter 'layer'. The contact material within the severed branch only, or 'true' contact material, is that obtained by logical ANDing the composite contact material derived with the 'cut metal'.

Connectivity extraction statements that serve to link, by means of a common name identifier or Net label ("emCheck"), each of the component materials of the severed branch are then derived. For this purpose, the label "emCheck" is applied to the cut metal, using a standard DRC routine, so as to associate a prescribed 'net' identifier with the branch. The true contact material is then 'connected' with or associated with the cut metal, so that the label will propagate throughout all of the contact material lying within the branch. In order to relate the electromigration (em) routine to all the metal within the branch, the branch em metal is defined as all of the cut metal having or attached to the label "emCheck". Similarly, in order to relate the electromigration (em) routine to all the contact material within the branch, the branch em contact material is defined as all of the true contact material having the label "emCheck".

Once all of the component materials (metal and contacts) of the severed branch have been identified, the process creates contact measurement statements. This operation involves examining the differential spacing between the edges of contacts and overlapping metal, and also the separation among adjacent contacts, in order to eliminate, from downstream processing, those edges of a contact/via that are effectively parallel to the direction of current flow and to consider only those edges that are perpendicular to current flow.

As a first step, the routine looks at the spacing between the side edges of a contact and adjacent metal. In particular, the process looks at the degree of overlap of metal relative to contact material and compares the degree of overlap with a prescribed value, as dictated by topography design rules. In a typical DRC process, the design rule for minimum step coverage requires that metal overlap a contact/via region by some minimum value (e.g. five microns). In accordance with the present invention, use is made of this DRC rule to infer the principal direction of current flow relative to the edges of the contact.

In particular, if the degree of overlap is greater than two times the minimum overlap, then it is inferred that the amount of metal alongside the contact is sufficient to effectively reduce the current density on the edge perpendicular to the side edge of the contact by absorbing some of the current at the sides of the contact. On the other hand, if the degree of overlap is less than or equal to two times the minimum overlap, then it is inferred that sufficient current flows into the edge of the contact perpendicular to the major direction of current flow, so that the dimensions of this edge of the contact must be evaluated in accordance with the electromigration rule set. In this second case, a region of the overlapping metal along the side edge of the contact is generated and labelled as such (OVLmet). Any contact edge contiguous with an OVLmet region is excluded from electromigration rule analysis, whereas the dimension of the contact edge orthogonal to the excluded edge is subjected to the minimum required by the electromigration rule.

To determine whether an overlap region (OVLmet) should be generated, the distance between a first side edge of a contact and a first side edge of the metal layer is measured and the distance between a second side edge of the contact and a second side edge of the metal layer is measured. Each respective distance is compared with two times the above referenced minimum overlap quantity. If the measured distance is less than the twice the minimum overlap quantity (10 microns, for example), then a respective overlap metal area or region is generated alongside that edge of the contact, and is identified as overlapping metal (OVLmet).

The second step of this routine looks at the relative dimensions of gaps between adjacent contacts. The process looks at the degree of separation of adjacent contacts, and compares the degree of separation with a prescribed value. If the degree of separation is within two times the minimum overlap, then a gap, identified as OVLgap, is generated between the contact edges. Thus, if the respective separations between each pair of adjacent contacts meet the two times the minimum overlap criterion, a respective minimum overlap gap region OVLgap would be generated at each of gaps between adjacent contacts.

As noted earlier, the purpose of examining the differential spacing between the edges of contacts and overlapping metal and the separation among adjacent contacts is to eliminate from further processing those edges of a contact/via that are effectively parallel to the direction of current flow and to consider only those edges that are perpendicular to current flow. Since the DRC mechanism typically employs area information, rather than pure edges, it is necessary to provide some minimum area to the edges of the contact. For this purpose, the next step of the process serves to grow, or slightly enlarge, each of the edges of a contact of interest by some minimum grid width or thickness. Each edge is grown by the minimum grid width to produce a set of boundary areas. The next step in the process examines the overlap metal regions to determine whether such overlap regions totally enclose the grown boundary areas. If so, then the corresponding edges of the contact are to be excluded from electromigration analysis. Then, those portions of the interconnect metal that are contiguous with edges of the contact that have been labelled as overlap (OVL) are labelled as OVLcut, so that they may be excluded from the process. What remains is contact edge which is perpendicular to the direction of current flow. This remaining edge is plotted as a contact edge and is stored as such in the database. The other edges of the contact, previously labelled as OVL, are plotted as contact overlap edges.

After plotting the contact edge perpendicular to current flow and the overlap regions OVL, the routine proceeds to grow each of plural ones of contacts that are relatively close together, in particular spaced apart from one another by no more than a prescribed minimum overlap as specified in accordance with the electromigration models. As a result, adjacent contacts that are within a minimum overlap separation from one another will effectively grow together and form a single enlarged contact. For example an array of four contacts may be grown into a larger area, denoted as 'contact area'.

Following the creation of contact measurement statements, the customized DRC statement generation sequence creates metal verification statements. In effect, the creation of metal verification statements involves, for each electromigration 'metal' rule, the plotting of those edges of metal of the severed branch or 'cut metal' that are not coincident with the previously cut layer edges and which have a width less than minimum metal for that metal. The electromigration model employed in the process may be a selected one of a plurality of rule sets, for example, the Black's Law Model or a military spec. model.

From whichever model the largest value of minimum width is produced, in accordance with the corresponding electromigration rule set, then that minimum width is compared with the actual separation between the edges of the metal layer. Wherever the metal width is less than the rule minimum width, an error value is generated, to be used in the branch measurement routine to be described. Once metal verification statements having been defined, the design rule check process now has all of the statements and associated data that it requires to apply the electromigration rules to the geometries of the topography layout and measure the physical dimensions of the branch in the direction perpendicular to current flow against the failure criteria predicted by the electromigration models. The purpose of this last step in the overall process is to graphically create or highlight error regions on the topography branch where electromigration failures will occur. In addition, the values of the dimensional changes required to bring an identified failure feature into compliance with the electromigration rules are specified on the displayed layout.

The DRC process is run using the customized DRC statements generated as described above. The metal width perpendicular to the direction of current flow is checked. Wherever the metal width being checked has a width that is less than the minimum width required by the electromigration model, an electromigration error metal region, in the form of a highlighted boundary region, is generated on the topography layout of the user graphics display device. Contact measurement attributes assembled in the course of creating the contact measurement statements are employed to check the contact width perpendicular to current flow, in accordance with the contact/via electromigration models. Wherever the dimension of the contact edge width perpendicular to current flow is less than the minimum width specified by the electromigration rule, that contact edge is highlighted on the display as an error region.

Since the error regions that are highlighted on the displayed topography layout are derived from the application of dimensional parameters of the original layout to the models, the user is also provided with the actual minimum width dimensions required to satisfy the failure criteria dictated by the models. The layout designer is thus able to use this data to interactively modify the dimensions of the layout to create a revised layout design. Once the revised layout design has been completed, the above process is repeated against the updated layout, to confirm that all dimensions of the metal, contact and via regions of the layout satisfy their associated electromigration models. Should any additional adjustment be necessary, the designer continues to iteratively refine the layout and rerun the program until the branch meets or exceeds all electromigration rule-based minimum dimensional requirements. This process is carried out for all branches of the layout, as specified by the designer, so as to demonstrate that the final overall integrated circuit layout design will satisfy MTF specifications. The circuit is then fabricated in accordance with a verified topography layout.

BRIEF DESCRIPTION OF THE DRAWINGS

FIG. 9 is a non-limitative example of a circuit topography parameter database employed by a CAD tool program;

FIG. 15 shows the compilation of a custom Design Rule Check (DRC) routine;

FIG. 16 is a set of respective sub-routine flow diagrams for generating cut statements for both metal and for identifying all contact material that reside within a topography branch;

FIGS. 17 and 18 diagrammatically illustrate the effect of the sub-routines of FIG. 16;

DETAILED DESCRIPTION

Figure 1:
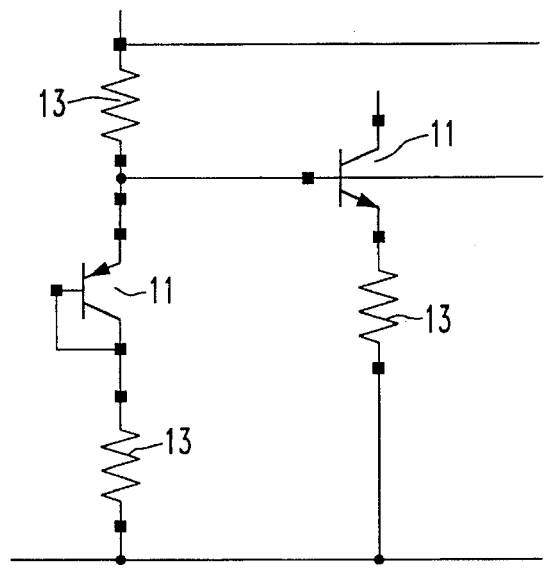
FIG. 1 is a simplified schematic illustration of an interconnected arrangement of active and passive circuit elements to be fabricated as an integrated circuit.

Before describing in detail the interactive electromigration rule-based topography adjustment process in accordance with the present invention, it should be observed that the invention resides primarily in what is effectively an adjunct to a conventional computer aided design (CAD) tool, in particular, a design rule check program, the engine for which is served by a design rule database for defining topography parameters that conform with a given semiconductor wafer fabrication process. For purposes of a providing a non-limitative example, the DRC program with which the present invention may be used may comprise a commercially available DRC program such as PD Check, operating with a CAD system program such as Framework I, supplied by Cadence Design Systems. As is customary in CAD systems, user interface devices, such as a menu driven graphics display and a keyboard or (point and click) mouse device, are preferably employed to facilite the user's interactively generating and adjusting the circuit topography design layout. The details of the CAD mechanism and the design rule check program that drives the system are otherwise essentially unaffected. Consequently, the manner in which the process steps of the present invention are interfaced with the CAD/DRC program is illustrated in the drawings by readily understandable flow diagrams and associated diagrammatic illustrations of a simplified interconnect layout which graphically depict the impact of the respective steps of respective stages of the process on the layout design. Namely, only those specific details that are pertinent to the present invention are described and illustrated, so as not to obscure the disclosure with details which will be readily apparent to those skilled in the art having the benefit of the description herein.

As pointed out briefly above, the automated electromigration rule-based methodology according to the present invention provides the circuit designer with the ability to identify and interactively modify (increase), to the extent necessary, the dimensions of one or more portions of branches of interconnect within the topography of an integrated circuit layout, that have been identified as requiring greater than minimum width dimensions in accordance with circuit operation-derived worst case current conditions as applied to a prescribed set of electromigration-based minimum width rules for interconnect metal and contacts/vias.

In order to facilitate an understanding of manner in which the present invention applies parametric data for a given circuit design to a set of electromigration rules and uses the output of the rules to identify and interactively tailor the dimensions of a circuit topography layout to satisfy the electromigration models, it is initially useful to examine the relationship between the circuit itself and the architecture of a layout through which the circuit is intended to be fabricated.

Figure 2:
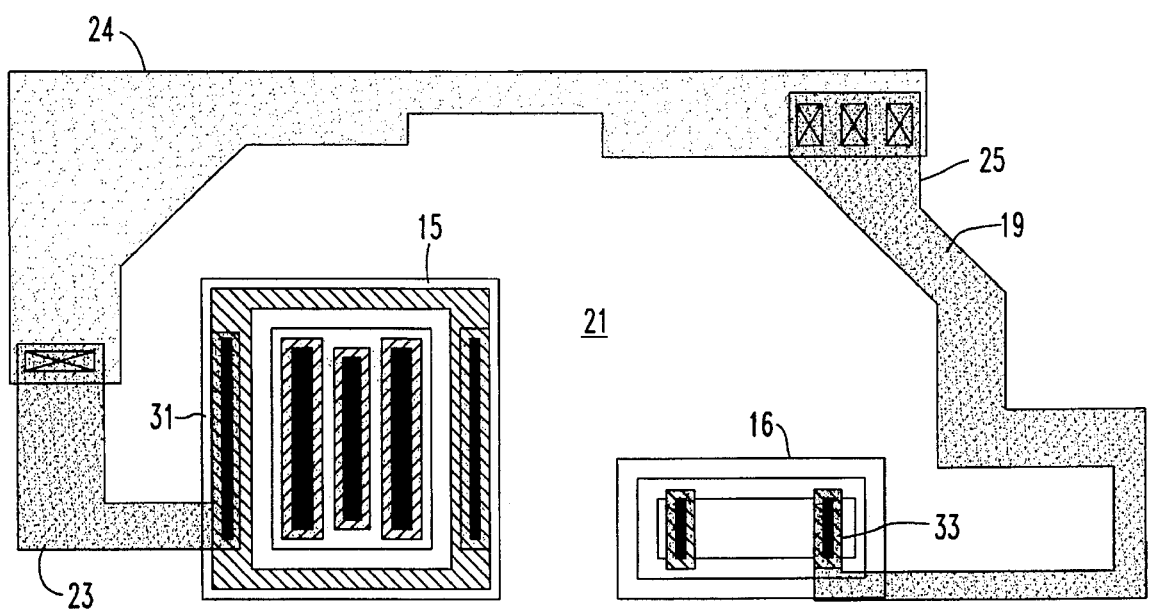
FIG. 2 diagrammatically illustrates the topography of a portion of an arbitrary integrated circuit layout.

FIG. 1 is a relatively simplified schematic illustration of an interconnected arrangement of active and passive circuit elements (bipolar transistors 11 and resistors 13 in the illustration), which is to be fabricated as an integrated circuit, while FIG. 2 diagrammatically illustrates the topography of a portion of an arbitrary integrated circuit layout, which contains circuit element regions 15, 16, such as those that are to be diffused or implanted in underlying semiconductor substrate or layer 21, together with associated layers 23, 24, 25 of interconnect metal, and sets of contacts and vias 31, 33. It should be observed that the circuit topography layout of FIG. 2 is not intended to be representative of a layout that implements the circuit of FIG. 1, but is merely intended to diagrammatically illustrate an example of a circuit layout topography that comprises an arbitrary set of interconnect metal, contact and via geometries of which a portion of an integrated circuit layout may be comprised. As is typically the case, the geometries of the interconnect metal are not necessarily configured as linear segments, but may and often have meandering shapes, as shown.

As a precursor to determining whether any portion of a given circuit layout may require a dimensional change, it is necessary to determine (both DC and transient) worst case currents flowing through respective branches of the circuit. For this purpose, as shown in the flow chart of FIG. 3, a standard circuit simulation flow is prepared (STEP 301) and, in STEP 302, the simulation is run. As a non-limitative example, a circuit simulation program, such as cdsSpice, from Cadence Design Systems, may be used.

For each simulation run, the worst case (largest produced) currents obtained for each branch and component in the circuit are stored in STEP 303. For repeated or subsequent simulation runs under varying sets of circuit operating conditions, the values of the stored worst case currents are updated, so that, at the end of the simulation sequence, STEP 303 will provide a set of largest magnitude worst case currents for the circuit design of interest.

In STEPS 304, 305 and 306, the largest worst case operational currents that have been derived and stored as a result of the simulation runs are classified as DC or transient currents and are then compared with maximum design currents for the circuit. In STEPS 307, 308, whichever current is larger (either the maximum design current or the largest worst case condition operating current OP) is identified as the maximum operating current (Imax) to be used in the interactive electromigration verification cycle to be described.

Figure 3:
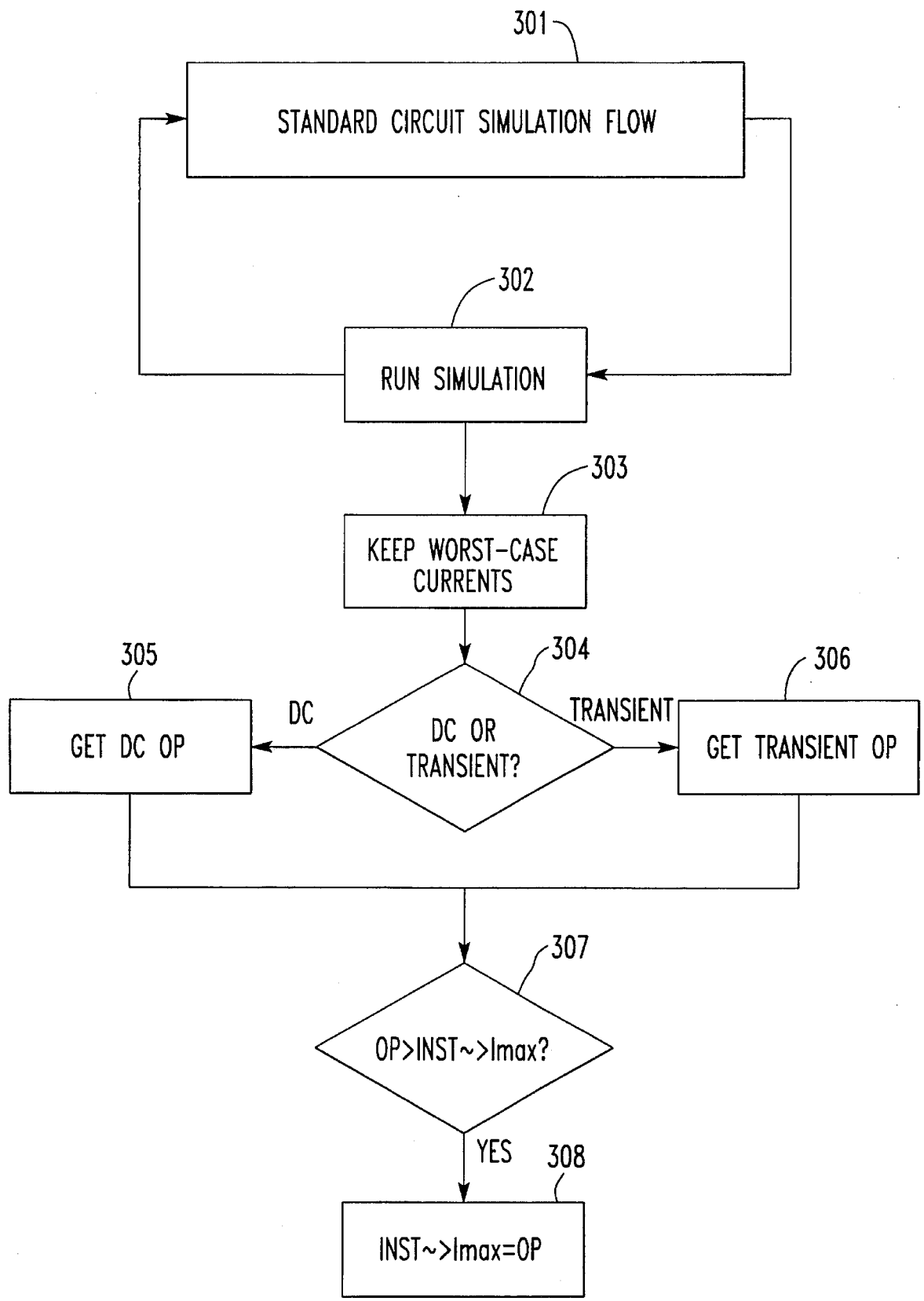
FIG. 3 is a flow chart of a standard circuit simulation flow for determining maximum operating currents through respective portions of a circuit layout.
Figure 4:
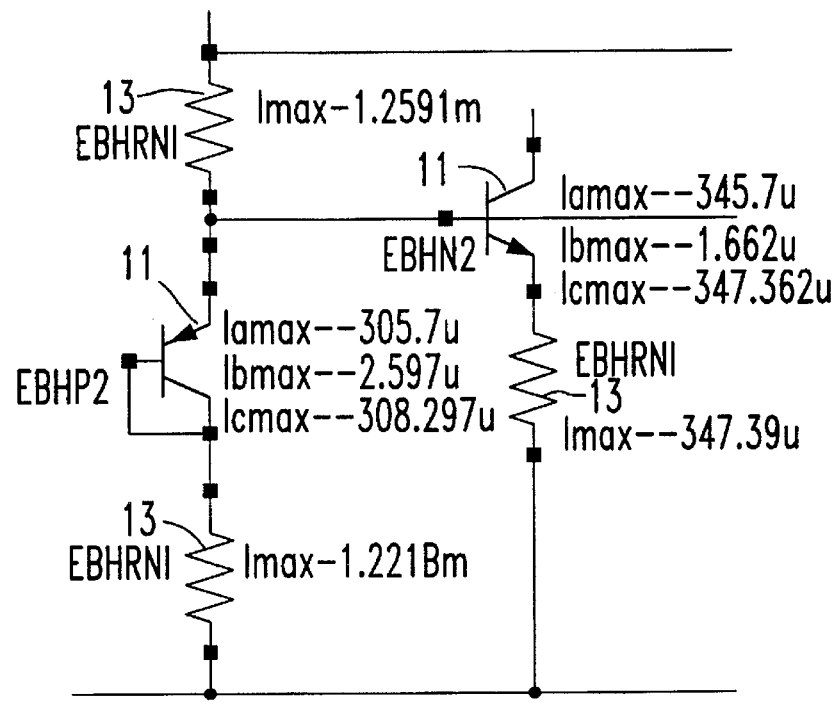
FIGS. 4 and 5 show the schematic illustration of FIG. 1 that has been back-annotated with maximum current and minimum metal width values derived from the operational simulation flow of FIG. 3.
Figure 5:
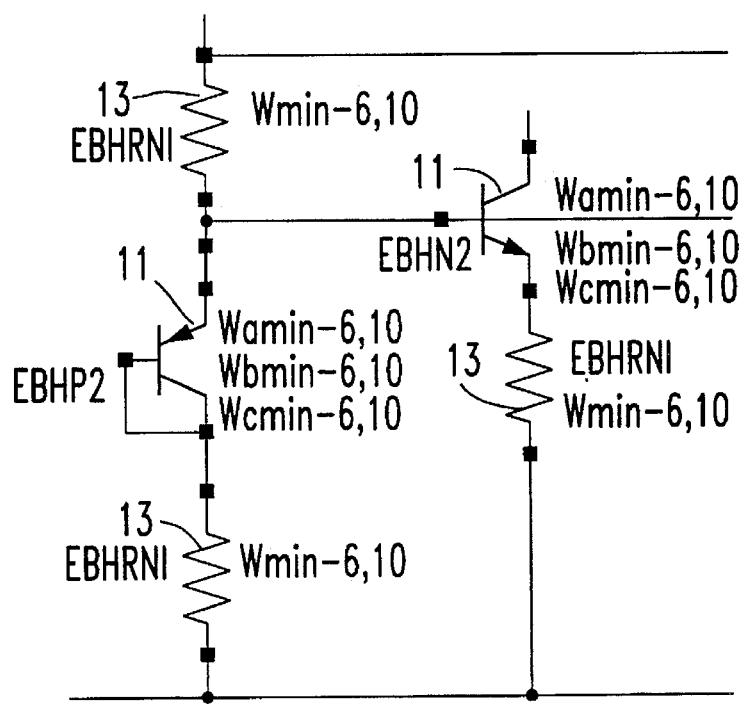

Once the values for the maximum worst case currents Imax have been derived from the flow diagram of FIG. 3, these current values Imax and associated minimum device geometries Wmin necessary to support such currents are back-annotated on the circuit schematic, as displayed on the user's display terminal, using an attendant graphic display device employed by the layout designer's CAD tool, with the current values and associated minimum device geometry values being displayed adjacent to the schematic devices, as diagrammatically illustrated in FIGS. 4 and 5, respectively.

With the worst case currents Imax now specified, the process according to the present invention is ready to interactively examine a respectively defined branch of a given integrated circuit layout design and determine whether any portion of that branch requires a dimensional change (increase) in order to satisfy minimum width requirements dictated by a set of electromigration models for respective metal, contact and via materials. The process is interactive in that it responds to inputs supplied by the layout designer and highlights, on an attendant graphical display device employed by the layout designer's CAD/DRC system to define the topography of the circuit, where dimensional changes are necessary.

Figure 6:
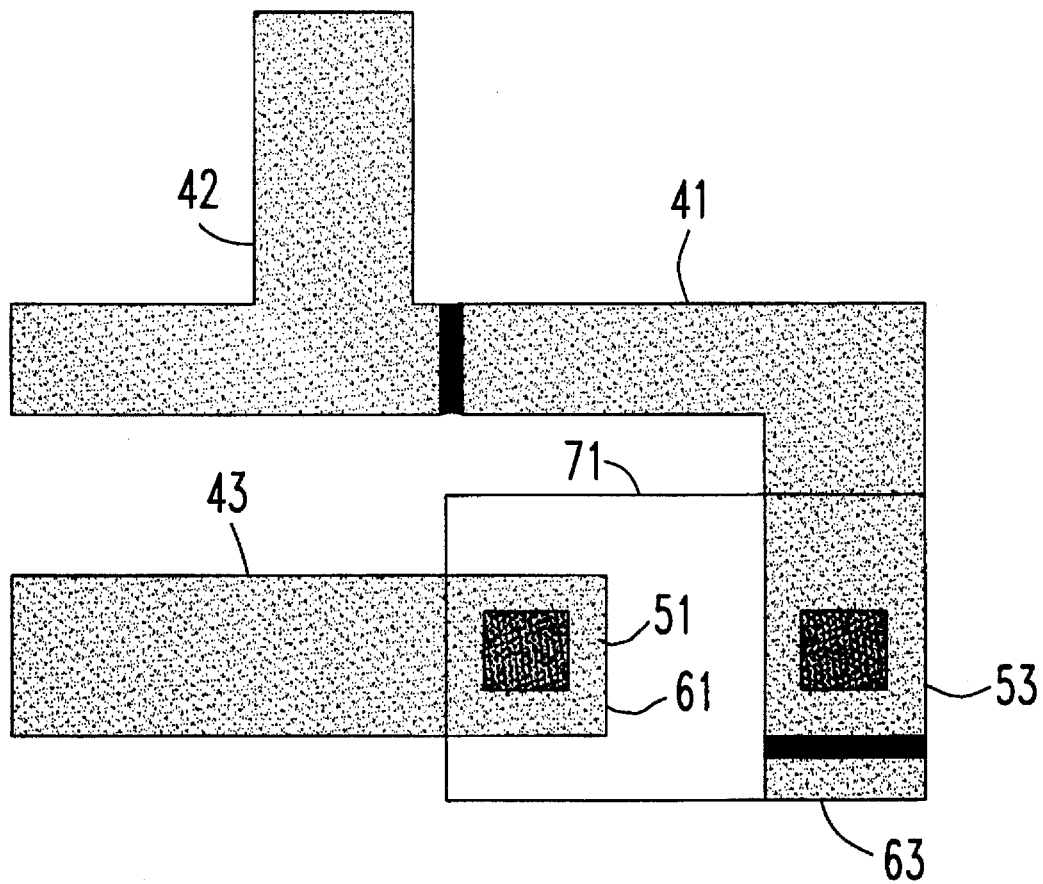
FIG. 6 diagrammatically illustrates a relatively simplified configuration of interconnect topography from which an integrated circuit topography branch is to be defined.

Referring now to FIG. 6, a relatively simplified configuration of interconnect topography from which a branch is to be defined is diagrammatically illustrated as comprising a first, generally L-shaped section 41 having a tab portion 42, and a second, generally linear section 43, respective ends 51 and 53 of which are to be electrically connected at contact regions 61 and 63 to an underlying region 71. In accordance with the first step in the process, the physical topography of a branch of the circuit layout, as specified by the user, is precisely delimited, and the maximum current through that branch topography is derived from the maximum current (Imax) data that has been obtained, as described above with reference to FIGS. 1, 3 and 4.

Figure 7:
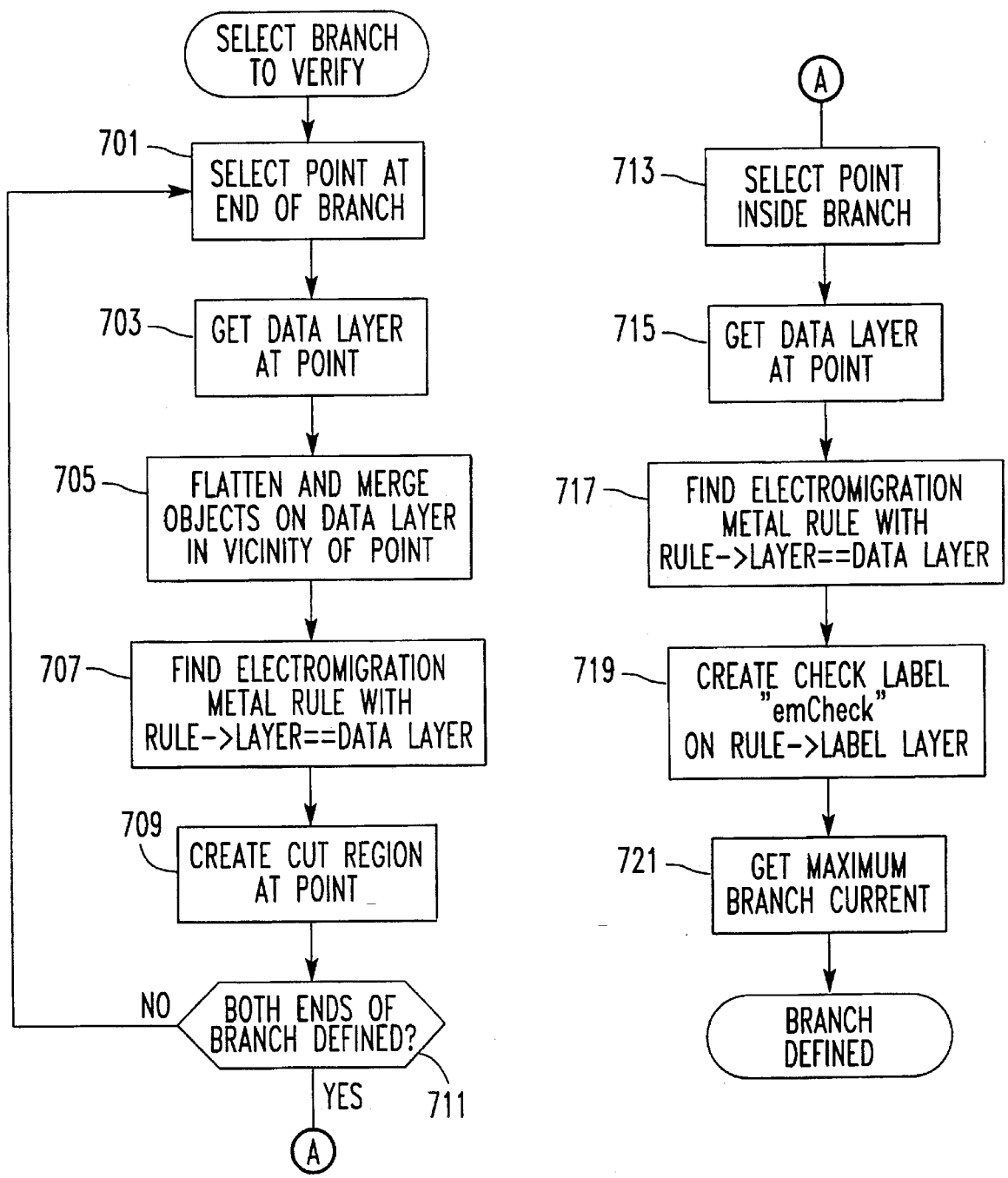
FIG. 7 is a flow chart of the process of defining a user-specified circuit topography branch.
Figures 8, 10:
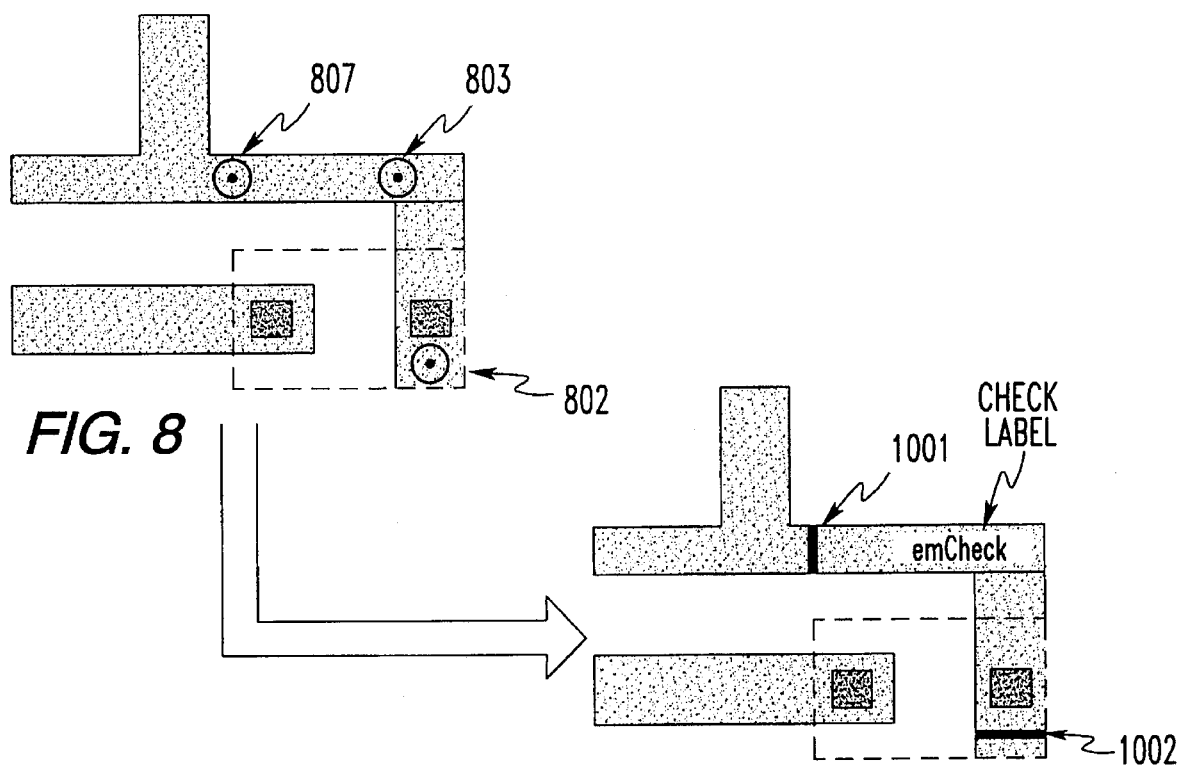
FIGS. 8 and 10 diagrammatically illustrate respective branch topographies associated with the flow chart of the process of FIG. 7.

More particularly, with reference to the flow chart of FIG. 7 and the diagrammatic topography illustration of FIG. 8, the process of selecting a circuit layout branch begins by the user's specifying respective locations at opposite ends of the branch of interest. As will be described, not only do the end points demarcate end boundaries of the branch, but they also are employed to establish cut regions that enable the branch to be separated from the remainder of the interconnect material, whereby an accurate electromigration analysis of the branch based upon only the maximum current associated with that branch, exclusive of other branches which intersect that branch, may be carried out.

For this purpose, in STEP 701 (using an attendant mouse device) the user selects a location, or end point, such as a point 801 that falls within the confines of the interconnect geometry as displayed on the CAD tool's graphics display device. From an associated topography layout parameter database employed by the CAD tool program, such as that illustrated in FIG. 9, the process looks at the material directly beneath the coordinates of the end point selected in STEP 703 and defines a 'data' layer as comprising this material. For purposes of a non-limitative example, it will be assumed that the interconnect material lying directly beneath end point 801 is a first layer of metal denoted as 'Metal 1' (or M1).

Next, in STEP 705, all interconnect materials (objects) that overlap or abut one another in the vicinity of the selected end point (801) are effectively 'flattened' and merged together on the graphics display, so as to form a displayed continuum of M1 interconnect material at that point. In STEP 707, the electromigration rule that is associated with the interconnect material that has been denoted in STEP 703 as the data layer beneath the end point is obtained. Non-limitative examples of electromigration rules for metalization links, contacts and vias, respectively, are set forth below in Tables 1, 2 and 3. In the present example, since the data layer has been identified as Metal 1, the electromigration rule for metalization in Table 1 is specified.

TABLE 1

Black's Law Model (1% failure in 10 years)

$$W_{min}=1/T-T\sigma(MTF)(I^n_{max})/\beta e^{[E\alpha/(K)(TEMP)]-\alpha\alpha[1/(m+n)]}+W_\Delta+W\sigma$$

where:

$W_{min}$—is the minimum allowable metal width

T—is the metal thickness

T$\sigma$—is the metal thickness process deviation

MTF—is the median time to fail (87600 hrs./10 yrs.)

$I_{max}$—is the maximum current through the metal line $\beta$, m, n—are experimental constants $E_a$—is the activation energy K—is the Boltzmann constant (8.62×10)

TEMP—is the temperature (Kelvin)

$\alpha$—is the cumulative failure constant (1%)

$\sigma$—is the lognormal failure rate

W$\Delta$—is the metal width process delta

W$\sigma$—is the metal width process deviation

CONTACT AND VIA GROUNDRULES

The equations set forth below allow the calculation of the current through an arbitrary contact or via, when the appropriate parameters are used, (See Table 4 below). The first term in each of the equations below represents the minimum contact and via respectively, assuming current flow through the leading edge only. It should be noted that the minimum contact width is 5 μm, and the minimum via width is 4 μm. The second term in each of the equations increases the allowed current for contacts or vias that are wider than the minimum allowed. The third term in each of the equations below allows for the current flow down the same fraction of the length of the contact or via, if the overlap is larger than the minimum allowed. It should also be noted that when the contact or via overlap is increased over the minimum allowed overlap, the maximum benefit, (in terms of the allowed current), occurs at 2× minimum overlap.

TABLE 2

MAXIMUM ALLOWED CURRENTS FOR CONTACTS (mA):

$$I=1.57W_{min}I_{\mu m}+(W-W_{min})I_{\mu m}+[1-(OVL-2OVL_{min})^2/(OVL_{min})^2)]I_\mu S(L-W_{min})$$

TABLE 3

MAXIMUM ALLOWED CURRENTS FOR VIAS (mA):

$$I=6.28I_{\mu m}+(W-4)I_{\mu m}+[1-OVL-10)^2/25]I_{\mu m}S(L-4)$$

DEFINITIONS:

W=The dimension of the contact or via that is perpendicular to the direction of the current flow, (μm). (This is not necessarily the smallest side of the contact or via.)

$W_{min}$=The smallest dimension of the contact or via, regardless of the direction of the current flow, (μm).

Iμm=The allowed current per micron of contact or via edge for the specified metal, (mA/μm). (See Table 4)

OVL=The overlap of metal-1 to the sides of a contact, or the overlap of metal-2 to the sides of a via (μm).

$OVL_{min}$=The minimum allowed overlap of metal-1 to the sides of a contact, or the minimum allowed overlap of metal-2 to the sides of a via, (μm).

S=The number of sides of the contact or via with a larger than the minimum allowed overlap. (1 or 2 only.)

L=The contact or via length in the direction parallel to the current flow (μm).

TABLE 4

CONSTANTS FOR THE MAXIMUM ALLOWED CURRENT EQUATIONS FOR CONTACTS AND VIAS

| PROCESS TECHNOLOGY | METALLIZATION OPTION | $W_{min}(\mu)$ | $OVL_{min}(\mu m)$ | $I_{\mu m}(mA/\mu m)$ 150° C. | 175° C. |
|---|---|---|---|---|---|
| EBHF | Al to Si(SLM) | 5.0 | 3.0 | 0.20 | 0.13 |
| EBHF | Al-1% CU to Si (SLM) | 5.0 | 3.0 | 0.82 | 0.53 |
| EBHF | Al-1% Si-2% Cu to Si (DLM) | 5.0 | 2.0 | 0.55 | 0.33 |
| RF-EBHF | Al-1% Cu to Si (SLM) | 3.0 | 1.0 | 0.63 | 0.41 |
| RF-EBHF | Al-1% Si-2% Cu to Si (DLM) | 3.0 | 2.0 | 0.55 | 0.33 |
| EBHF & RF-EBHF | Al to Al-1% Si-2% Cu (DLM) | 4.0 | 5.0 | 0.54 | 0.37 |

TABLE 5

MAXIMUM ALLOWED CURRENTS FOR THE MINIMUM CONTACT/VIA SIZE AND MINIMUM OVERLAP (See Table 4)

| PROCESS TECHNOLOGY | METALLIZATION OPTION | I(mA) 150 deg C. | 175 deg C. |
|---|---|---|---|
| EBHF | Al to Si (SLM) | 1.59 | 1.00 |
| EBHF | Al-1% Cu to Si (DLM) | 6.46 | 4.15 |
| EBHF | Al-1% Si-2% Cu to Si (DLM) | 4.28 | 2.58 |
| RF-EBHF | Al-1% Cu to Si (SLM) | 2.98 | 1.91 |
| RF-EBHF | Al-1% Si-2% Cu to Si (DLM) | 2.57 | 1.54 |
| EBHF & RF-EBHF | Al to Al-1% Si-2% Cu (DLM) | 3.39 | 2.32 |

A characteristic of the DRC program referenced previously is the fact that, in order to demarcate and sever portions of interconnect from one another a region of some prescribed area is required. For this purpose, at STEP 709, the process creates a 'cut region' shown at 1001 in FIG. 10 at the end point of interest—here, end point 801. The coordinates of the boundaries of the cut region are established in accordance with the process flow routine shown in FIG. 11 and the accompanying diagrammatic illustration of FIG. 12.

More particularly, at STEP 1101, a point inside the interconnect branch (or the merged polygon geometry produced by STEP 705) of interest where a cut is to be made is selected. In effect, for the first point 801 of FIG. 8, specified previously, therefore, STEP 1101 corresponds to STEP 701. In the polygon illustration of FIG. 12, at the present stage of the process, the point 801 of FIG. 8 corresponds to a selected point 1210. Next, at STEP 1103, the respective perimeter edges of the interconnect branch or polygon are identified in terms of their spatial geometry coordinates at the ends of each edge. For the example of the arbitrarily shaped eight edge polygon of FIG. 12, a first polygon edge 1201 of the eight edges 1201–1208 is denoted by its (x,y) coordinates at opposite ends 1201-1 and 1201-2. Similarly, a second polygon edge 1202 is denoted by its (x,y) coordinates at opposite ends 1202-1 and 1202-2, where edge end 1202-1 of edge 1202 is coincident with edge end 1201-2 of edge 1201.

Figure 12:
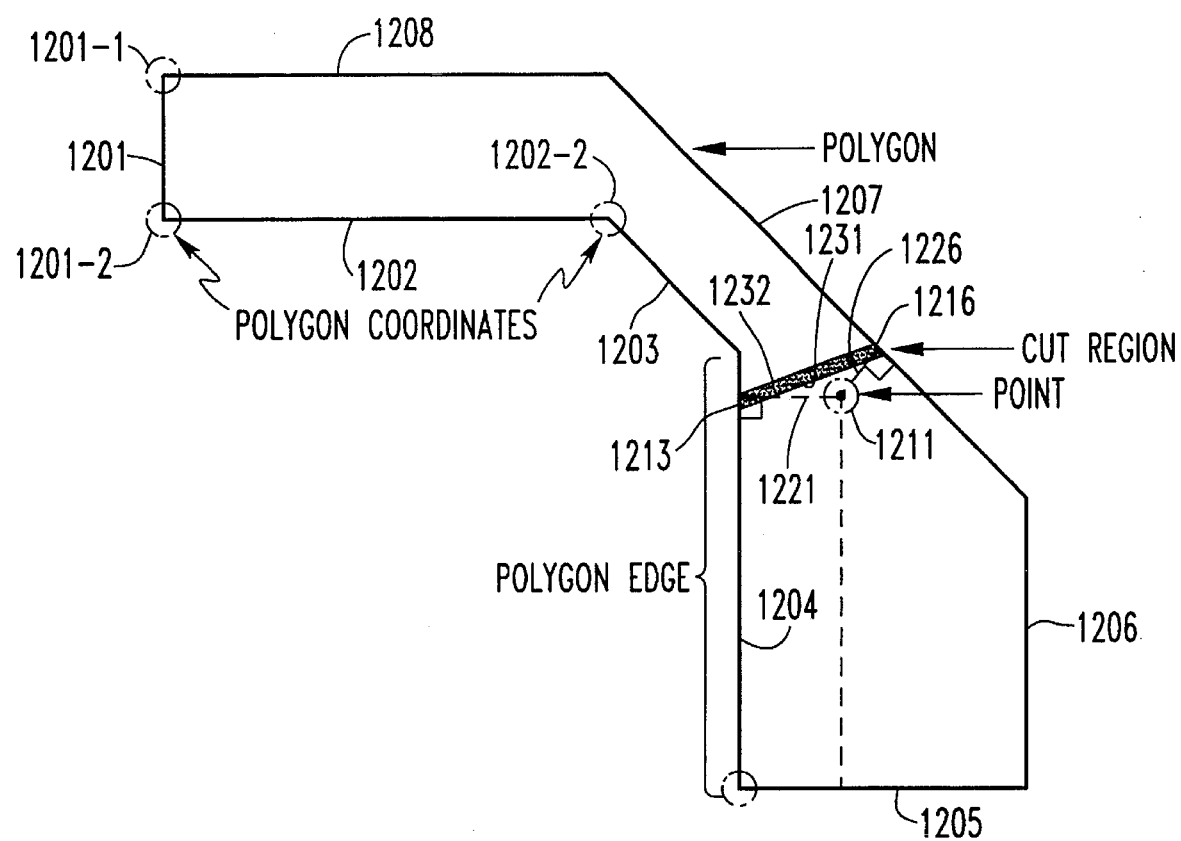
FIG. 12 diagrammatically illustrates a branch topography associated with the flow chart of the process of FIG. 11.

At STEP 1105, one of the edges of the polygon that is adjacent to the selected point (1210) is specified. For the present example, polygon edge 1204, which is shown in FIG. 12 as being adjacent to point 1210, is selected. By adjacent is meant a polygon edge, a line normal to and from which passes through the selected point, without first intersecting another polygon edge. For the present example, one such edge is polygon edge 1204, where a line 1224 normal to edge 1204 passes through point 1210 without first intersecting another edge. Additional adjacent polygon edges are edges 1205 and 1207. None of the remaining polygon edges (i.e. edges 1201, 1202, 1203, 1206 and 1208) is an adjacent edge.

Next, at STEP 1107, the selected point (1210) is projected along the line 1224 perpendicular to the specified polygon edge, here edge 1204 and the projected distance between the coordinates of the selected point and the edge is determined. The cut region routine next proceeds to query STEP 1109, which inquires whether the projected distance is the lowest value thus far determined, indicating that the polygon edge of interest is the edge closest to the selected point. For the first adjacent edge selected (here edge 1204) the answer to STEP 1109 is Yes, and the coordinates of the intersection 1214 of the projection line 1224 and the polygon edge 1204 are saved in STEP 1111 as a value 'proj1'.

The cut region routine next proceeds to query STEP 113, which inquires whether there are any additional polygon edges which are adjacent to the selected point 210. As noted above there are two additional edges, i.e. edges 1205 and 1207, which are adjacent to point 1210. Thus, the answer to STEP 1113 is NO, and the process proceeds to STEP 1105. STEPS 1105–1113 are repeated for edges 1205 and 1207. For edge 1205, the distance along perpendicular line 1225 between point 1210 and its intersection 1215 at edge 1205 is greater than the distance between the currently stored value for 'proj1', so that the value of 'proj1' is not updated. However, for edge 1207, the distance along perpendicular line 1227 between point 1210 and its intersection 1217 at edge 1207 is less than the currently stored value for 'proj1', so that the value of 'proj1' is updated to the value of the coordinates of the intersection 1217 of the perpendicular line 1227 with edge 1207.

With all of the adjacent edges having been processed, the answer to STEP 1113 becomes YES and the routine proceeds to step 1115 to find the next closest adjacent edge. In step 1115, the projection measurement steps described above are executed, except that closet edge 1207 is excluded from the routine. From the previous sequence, it will be determined that polygon edge 1204 is the next closest, so that the coordinates of the intersection 1214 are stored in STEP 1115 as 'proj2'.

Next, in STEP 1117, a first line segment 1237 is drawn between the coordinates of 'proj1' and 'proj2'. In addition, a second line 1232 segment is drawn parallel to line segment 1237 and intersecting polygon edges 1204 and 207. Line segment 1232 is defined so as to be spaced apart from line segment 1237 by some prescribed nominal number of graphical numerical units. This spacing defines, together with respective portions of polygon edges 1204 and 1207, that join together line segments 1237 and 1232 at STEP 1119, a narrow strip region used by the CAD program to draw a nominal portion of metal to be cut away from the interconnect, and thereby sever the interconnect into two spaced apart portions at that point. At STEP 1121, this cut region (shown at 1001 in FIG. 10) is drawn on that layer specified in the list of parameters (FIG. 9) of the associated electromigration rule (here the parameter list for metal M1), denoted as the cutLayer ("fm0"). For an end point, here end point 801 in FIG. 8, the effect is to sever one end of the branch from adjacent metal.

Figure 11:
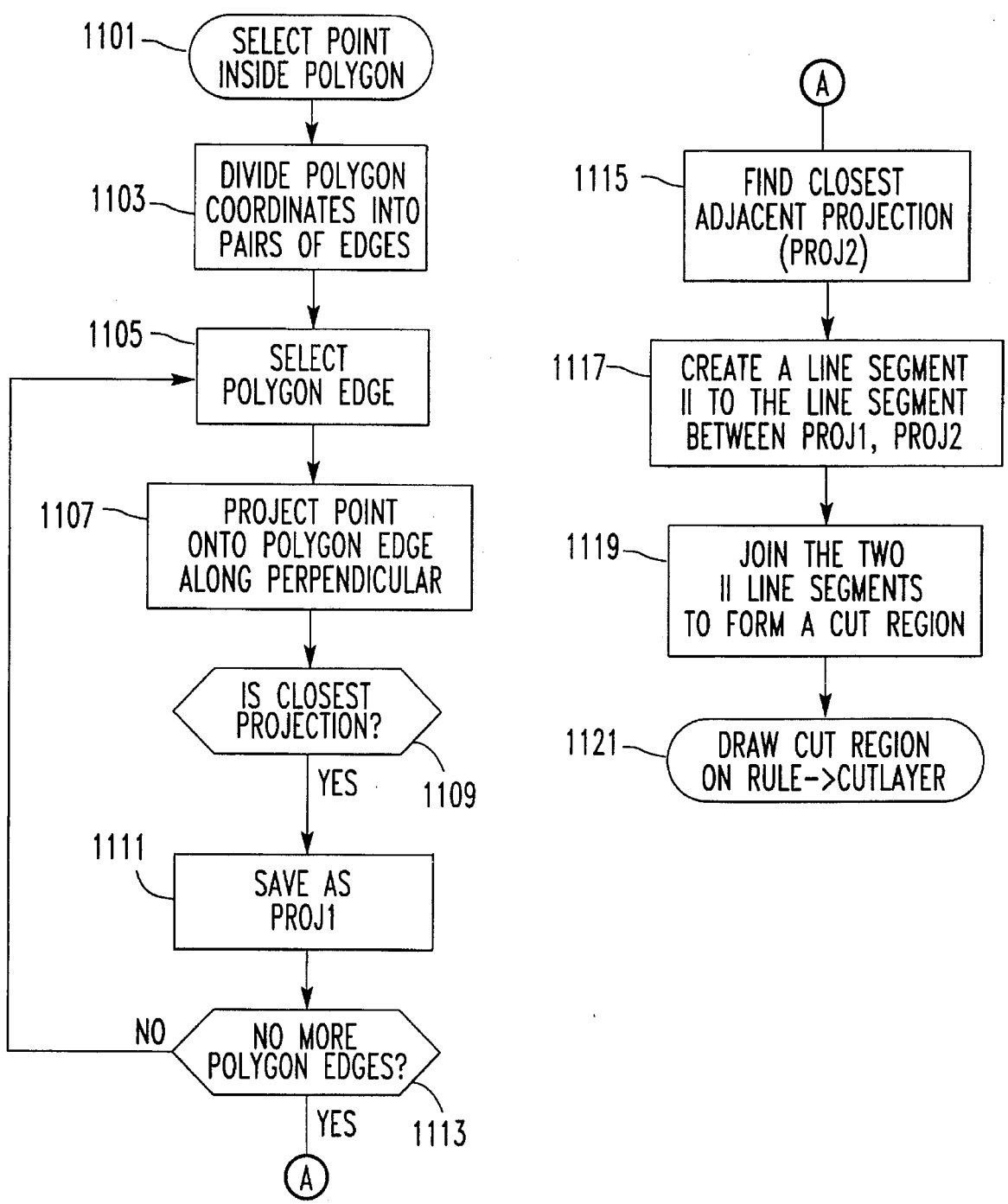
FIG. 11 is a flow chart of a routine for establishing the boundaries of a cut region.

At the completion of step 1121 in the cut region sub-routine of FIG. 11, corresponding to STEP 709 of FIG. 7, the process transitions to query STEP 711 of the branch defining routine of FIG. 7 to determine whether both ends of the branch have been defined. For the present stage of the process the answer to STEP 711 is NO, so that the process returns to STEP 701. The user next defines the second end point of the branch, shown in FIG. 8 as end point 802 and the foregoing sequence of steps is carried out for the second end point. At the conclusion of STEP 709, a second cut region will have been drawn on the interconnect layout branch, as shown at 1002 in FIG. 10. With both end point cut regions drawn, the answer to query STEP 711 will be YES, and the process proceeds to STEP 713.

At STEP 713, the user selects an arbitrary point on the branch between the end points, namely, inside the branch, as shown at 803 in FIG. 8. At STEP 715, the type of interconnect material directly beneath point 803 is identified as a data layer, and in STEP 717, the electromigration rule associated with that identified data layer. In the present example, the data layer is the M1 layer. In STEP 719, from the associated M1 parameter list in FIG. 9, a label "emCheck" is created for the labelLayer. As will be described, the label "emCheck" is used as a generic term to identify the composite set of materials of which the branch is formed.

At the completion of STEP 719, the process of FIG. 7 proceeds to STEP 721, in order to set the maximum current through the branch. The details of STEP 721 are set forth in the sub-routine flow of FIG. 13 and the accompanying multipath branch current summation diagram of FIG. 14. In order to determine the maximum branch current it is necessary to take into account currents flowing into the branch via all paths that feed the branch. The sub-routine of FIG. 13 involves summing the currents that enter a respective branch from whatever the entry points to the branch, including currents specified from the operational schematic and currents not specified for a respective branch entry point.

Figure 13:
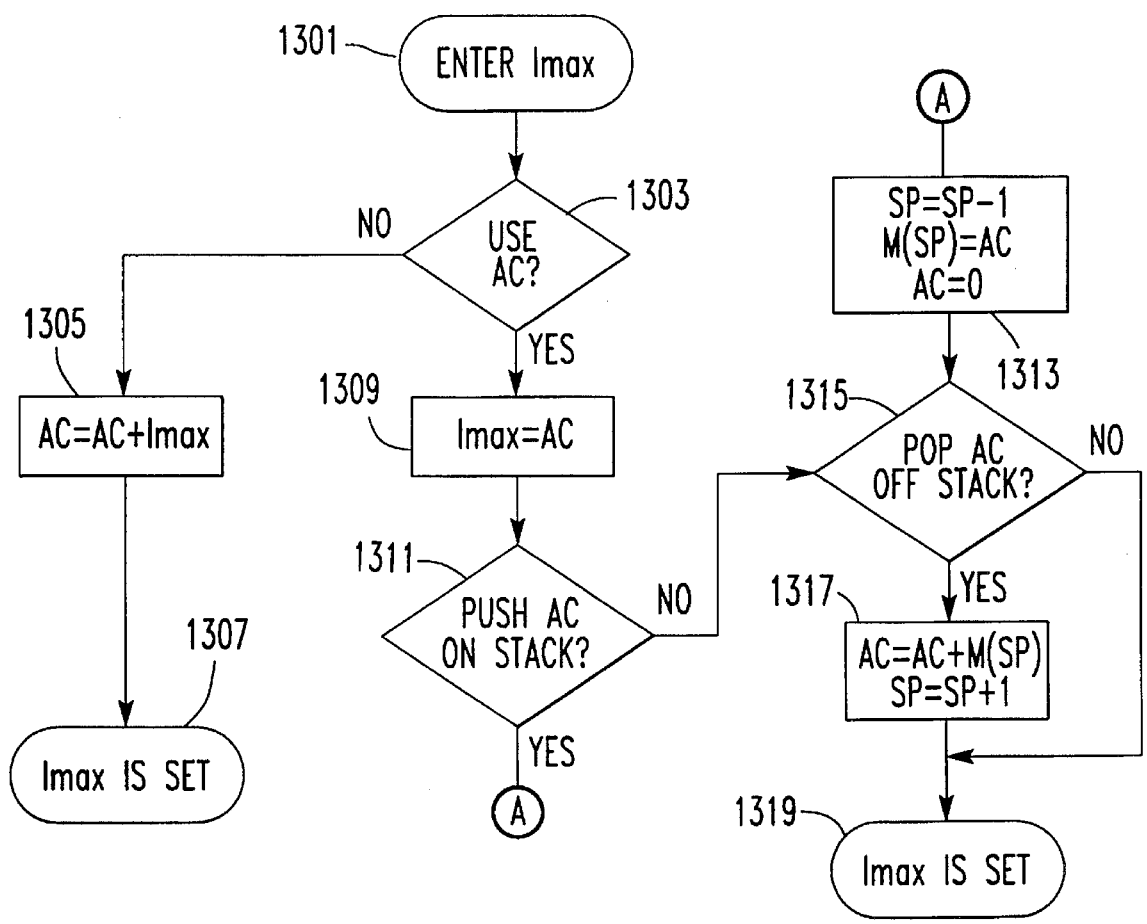
FIG. 13 is a flow chart of a routine for determining maximum currents through respective branches of a circuit topography.

More particularly, for a respective branch of the circuit topography the sub-routine of FIG. 13 examines each and every path by way of which a current is supplied and accumulates or sums the path currents, as necessary to derive the total current through the branch. It should be noted that the precursor maximum current simulation, described above, only provides currents through devices in the respective paths between circuit nodes. The process of FIGS. 13 and 14 looks at paths, not currents through or into devices.

Figure 14:
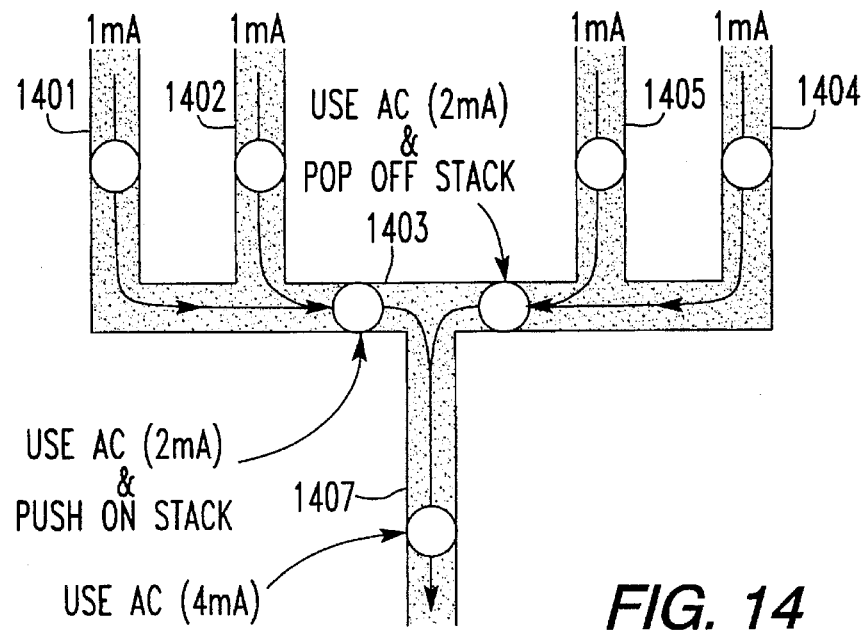
FIG. 14 is a multipath branch current summation diagram associated with the maximum current determination routine flow of FIG. 13.

The sub-routine starts at STEP 1301, which looks at a respective branch of the layout, here the first branch denoted as branch 1401 in the branch layout diagram of FIG. 14, and enters the maximum current Imax for that path. Namely, at STEP 1301, the value of Imax for a first branch 1401 (e.g. 1 mA) is obtained. At STEP 1303 of the routine, an inquiry is made as to whether or not the accumulator (the contents of which are initially cleared or set to zero) should be used for the branch. Since, from the layout, branch 1401 receives only a single known value (1 mA in the illustrated example), there is no need to use the accumulator, so the answer to STEP 1303 is NO, and the routine transitions to STEP 1305. At STEP 1305, the present contents of the accumulator are incremented (from zero) by the supplied current value Imax, for use with summation branches to be described. At STEP 1307, the supplied value of Imax=1 mA is set for branch 1401 at the value entered at STEP 1301. Once the maximum current value for the first branch 1401 is established, the process proceeds to the compilation of a custom DRC routine in FIG. 15, described below.

For the topography example of FIG. 14, after processing the first branch 1401, the process transitions to the second branch 1402 to determine its maximum current value Imax. Again, at the first STEP 1301, which now looks at the second branch of the layout, denoted as branch 1402 in the branch layout diagram of FIG. 14, and enters the maximum current (Imax=1 mA in the present example) for that path. At STEP 1303 of the routine, an inquiry is again made as to whether or not the accumulator (the contents of which are now set at 1 mA) should be used for the branch. Since, from the layout, branch 1402 receives only a single known value (1 mA in the illustrated example), there is no need to use the accumulator, so the answer to STEP 1303 is NO, and the routine transitions to STEP 1305. At STEP 1305, the present contents of the accumulator (1 mA) are incremented by the supplied current value of Imax=1 mA for the second branch, for use with summation branches to be described. At STEP 1307, the supplied value of Imax=1 mA is set for branch 1402 at the value entered at STEP 1301. Once the maximum current value for the second branch 1402 is established, the process proceeds to the compilation of the custom DRC routine in FIG. 15.

After processing the second branch 1402, the process transitions to the third branch 1403 to determine its maximum current value Imax. Again, at the first STEP 1301, which now looks at the third branch of the layout, denoted as branch 1403 in the branch layout diagram of FIG. 14, and enters the available maximum current for that path. Here, that current is unknown or not given, so that Imax for the third branch is initially set at zero. At STEP 1303 of the routine, an inquiry is again made as to whether or not the accumulator (the contents of which are now set at 2 mA) should be used for the third branch 1403. Since, from the layout, branch 1403 receives current from a summation of upstream branches 1401 and 1402, it is necessary to use the accumulator. Thus, the answer to STEP 1303 is YES, and the routine transitions to STEP 1309. At STEP 1309, the value of Imax for the third branch is set at the present contents of the accumulator (2 mA).

Next, STEP 1311 inquires whether the present value of the accumulator should be saved for future use in a downstream branch that requires additional accumulation from other branches of the topography. Since, as can be seen from the topography example of FIG. 14, additional summation will be required, the answer to STEP 1311 is YES, attendant memory or stack (M) and an associated stack pointer (SP) are used. In particular, at STEP 1313, the value of the accumulator is pushed onto the stack (M[SP]=AC), the stack pointer address is decremented by one (SP=SP−1), and the accumulator is cleared (AC=0).

At STEP 1315, an inquiry is made whether to access the stack. For the topography of FIG. 14, the third branch 403 has no additional feed paths, so that the answer to STEP 1315 is NO and, at STEP 1319, the value of Imax is set at the value specified in STEP 1309 (here 2 mA, corresponding to the summation of the currents in branches 1401 and 1402), which establish the total maximum current for branch 1403. With the maximum current value for the fourth branch 1403 now established, the process proceeds to the compilation of the custom DRC routine in FIG. 15.

After determining the branch current for the third branch 1403, the sub-routine returns to STEP 1301, which looks at the fourth branch of the layout, branch 1404, and enters the maximum current Imax for that branch. Namely, at STEP 1301, the value of Imax for a fourth branch 1404 (e.g. 1 mA) is obtained. At STEP 1303 of the routine, the inquiry is again made as to whether or not the accumulator (the contents of which were cleared at STEP 1313) should be used for the branch. Since, from the layout, branch 1404 receives also only a single known value (1 mA in the illustrated example), there is no need to use the accumulator. Thus, the answer to STEP 1303 is NO, and the routine transitions to STEP 1305. At STEP 1305, the present contents of the accumulator are incremented (from zero) by the supplied current value Imax (1 mA), for use with the sixth and seventh summation branches 1406 and 1407 to be described. At STEP 1307, the supplied value of Imax=1 mA is set for branch 1404 at the value entered at STEP 1301. With the maximum current value for the fourth branch 1404 established (Imax=1 mA), the process proceeds to the compilation of a custom DRC routine in FIG. 15.

After determining the maximum current for the fourth branch 1404, the process transitions to the fifth branch 405 to determine its maximum current value Imax. Again, at the first STEP 1301, which now looks at the fifth branch 1405, and enters the maximum current (Imax=1 mA in the example of FIG. 14) for that branch. At STEP 1303 of the routine, an inquiry is again made as to whether or not the accumulator (the contents of which are now set at 1 mA) should be used for the branch. Since, from the layout, branch 1405 also receives only a single known value (1 mA in the illustrated example), there is again no need to use the accumulator, so the answer to STEP 1303 is NO, and the routine transitions to STEP 1305. At STEP 1305, the present contents of the accumulator (1 mA) are incremented by the supplied current value of Imax=1 mA for the fifth branch, for use with sixth and seventh summation branches, as will be described. At STEP 1307, the supplied value of Imax=1 mA is set for branch 1405 at the value entered at STEP 1301. Once the maximum current value for the fifth branch 1405 is established, the process proceeds to the compilation of a custom DRC routine in FIG. 15.

After processing the fifth branch 1405, the process transitions to the sixth branch 1406 to determine its maximum current value Imax. Here, like the third branch 1403, the current is unknown or not given, so that Imax for the sixth branch 1406 is initially zero at STEP 1301. At STEP 1303 of the routine, an inquiry is again made as to whether or not the accumulator (the contents of which are now set at 2 mA) should be used for the third branch 1403. Since, from the layout, branch 1403 receives current from a summation of upstream branches 1404 and 1406, it is necessary to use the accumulator. Thus, the answer to STEP 1303 is YES, and the routine transitions to STEP 1309. At STEP 1309, the value of Imax for the sixth branch 1406 is set at the present contents of the accumulator (2 mA).

Next, STEP 1311 again inquires whether the present value of the accumulator should be pushed on the stack. Since, as can be seen from the topography example of FIG. 14, there are no additional branches that feed branch 1406, the answer to STEP 1311 is NO. Thus, the process proceeds to STEP 1315, the answer to which is YES. Then, in STEP 1317, the process accesses the memory or stack and sets the accumulator to its current value (2 mA) plus the value 'popped' off the stack (also 2 mA), so that the contents of the accumulator are increased to 4 mA. Next, at STEP 1319, the value of Imax, previously set at STEP 1309 at 2 mA is defined as the maximum current for the sixth branch. With the maximum current value for the sixth branch 1406 is established, the process proceeds to the compilation of a custom DRC routine for branch 1406 in FIG. 15.

After processing the sixth branch 1406, the process transitions to the seventh branch 1407 to determine its maximum current value Imax. Again, at the first STEP 1301, the routine looks at the seventh branch 1407 of the layout and enters the available maximum current for that path. Here, like the third branch 1403 and the sixth branch 1406, the current is unknown or not given, so that Imax for the seventh branch 1407 is initially set at zero. At STEP 1303 of the routine, an inquiry is again made as to whether or not the accumulator (the contents of which are now set at the current total derived from branches 1403 and 1406) should be used for the seventh branch 1407. Since, from the layout, branch 1407 receives current from a summation of upstream branches 1403 and 1406, the answer to STEP 1303 is YES, and the routine transitions to STEP 1309. At STEP 1309, the value of Imax for the seventh branch is set at the present contents of the accumulator (presently set at 4 mA).

Next, STEP 1311 again inquires whether the present value of the accumulator should be saved for future use in a downstream branch that requires additional accumulation from other branches of the topography. Since, as can be seen from the topography example of FIG. 14, there are no remaining branches, the answer to STEP 1311 is NO and the process proceeds to STEP 1315. At STEP 1315, an inquiry is made whether to access the stack. For the topography of FIG. 14, the seventh branch 1407 has no additional feed paths, so that the answer to STEP 1315 is NO and the value of Imax is set at the value specified in STEP 1309 (here mA, corresponding to the accumulator total of the currents in branches 1403 and 1406, which establish the total maximum current for the seventh branch 1407. With the maximum current value for the sixth branch 1407, the process proceeds to the compilation of a custom DRC routine in FIG. 15.

Once a respective branch has been defined and its maximum current determined in accordance with the processing flow of FIGS. 7–14, the methodology of the present invention proceeds to compile a set of customized Design Rule Check (DRC) statements, which can be executed by the DRC, an example of which is set forth in FIG. 15. The customized DRC statements, such as those listed in FIG. 15, are compiled in accordance with the physical topography of the defined branch and the maximum current through the branch, and the electromigration rules for respective interconnect materials comprising the branch. Both the path of current flow through the branch and electromigration-specific measurement parameters that simplify adjustment of dimensions of one or more portions of the branch topography are derived.

The first step in the DRC statement compilation routine shown in FIG. 15 is to create DRC 'cut' statements, through the execution of which the branch is severed or 'cut' from the remainder of the interconnect topography. As described previously with reference to the flow routine of FIG. 7 and as depicted in the branch topography diagram of FIG. 10, end points of the branch are employed to demarcate nominally thin cut regions at the severance points. The DRC cut statements are generated to define executable instructions for cutting the branch away from the remainder of the interconnect topography.

FIG. 16 contains respective sub-routine flow diagrams for generating cut statements for both metal (Part and for identifying all contact material that resides within the branch of interest (Part 2). In the metal sub-routine (Part 1), at STEP 1601, all of the metal of the branch is assembled into a composite metal continuum by logically combining (ORing) all the metals in the electromigration parameter listings of FIG. 9 that correspond to 'layer'. For the present example, there are two metals—Metal 1 (M1) and Metal 2 (M2) within the branch. In STEP 1603, the cut metal, i.e. the intended branch, is defined as that portion of the composite metal obtained from STEP 1603 resulting from a logical (Boolean) 'ANDNOT' operation on the composite metal with that portion of the interconnect metal corresponding to the identity 'cutLayer' in FIG. 9. Namely, the ANDNOT operation of STEP 1603 serves to exclude from the composite metal layer the cut regions defined in STEP 1119 of the sub-routine of FIG. 11. What remains is a region of 'cut metal', i.e. the intended branch severed from the interconnect metal.

Shown at Part 2 of FIG. 16 is a contact subroutine for identifying all of the contact material that lies within the confines of the 'cut metal' (severed branch), but excludes contact material lying outside the branch. At STEP 1604, all of the contact material of a respective layer is combined into 'composite contact' material by logically combining (ORing) those contact materials in the parameter listings of FIG. 9 that correspond to the parameter 'layer'. Next, in STEP 1606, all of the contact material within the severed branch only, or 'true' contact material, is that obtained by logical ANDing the composite contact material derived in STEP 1604 with the 'cut metal' obtained in step 1603 (Part 1). The effect of the subroutines of FIG. 16 is diagrammatically illustrated in FIGS. 17 and 18, which show the branch or 'cut metal' 1700/1800 severed from the remaining portion of the interconnect by cut regions 1701/1702, 1801/1802.

Figure 19:
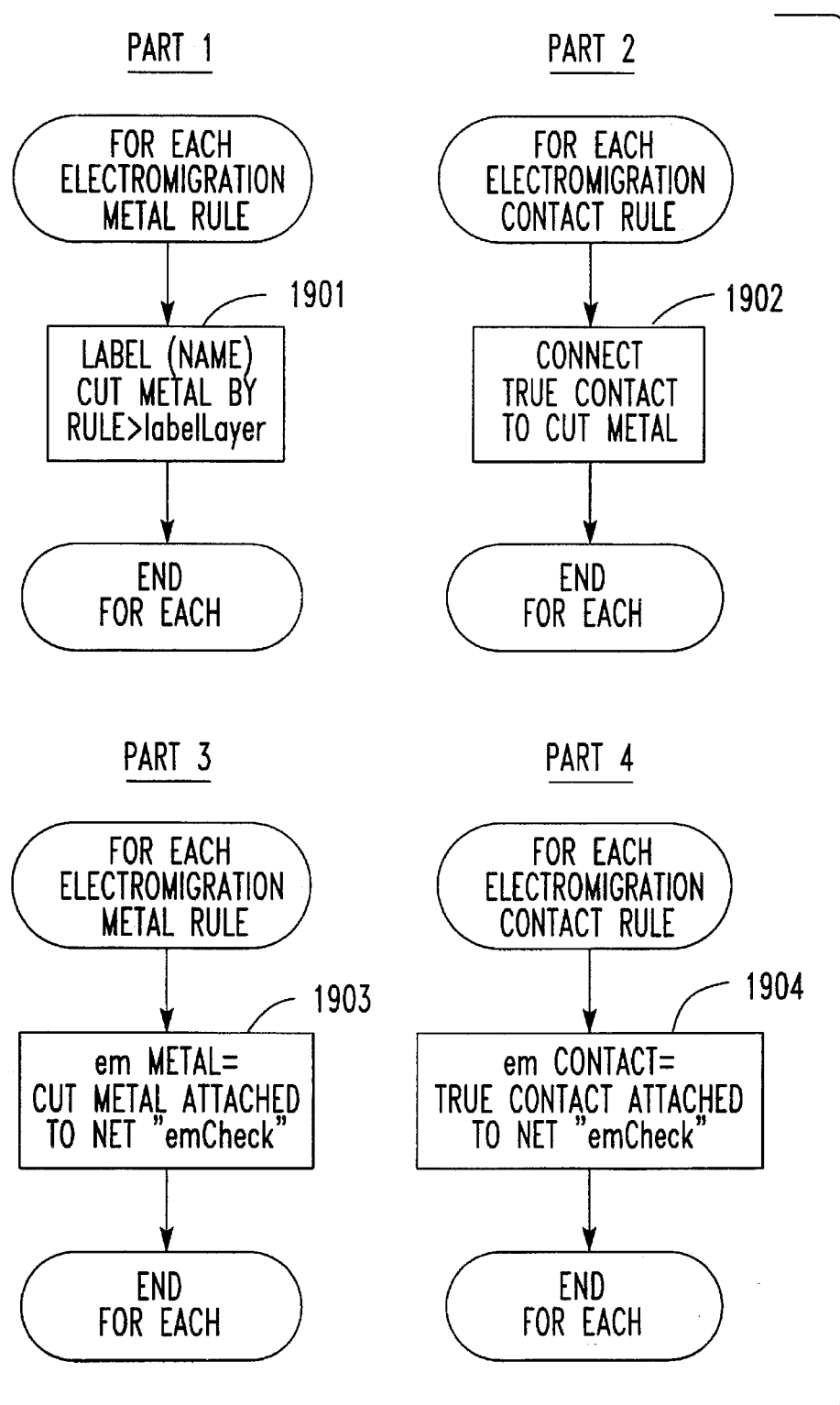
FIG. 19 contains a set of flow listings for deriving connectivity extraction statements that serve to link each of component materials of the severed branch obtained in STEP 16.
Figure 20:
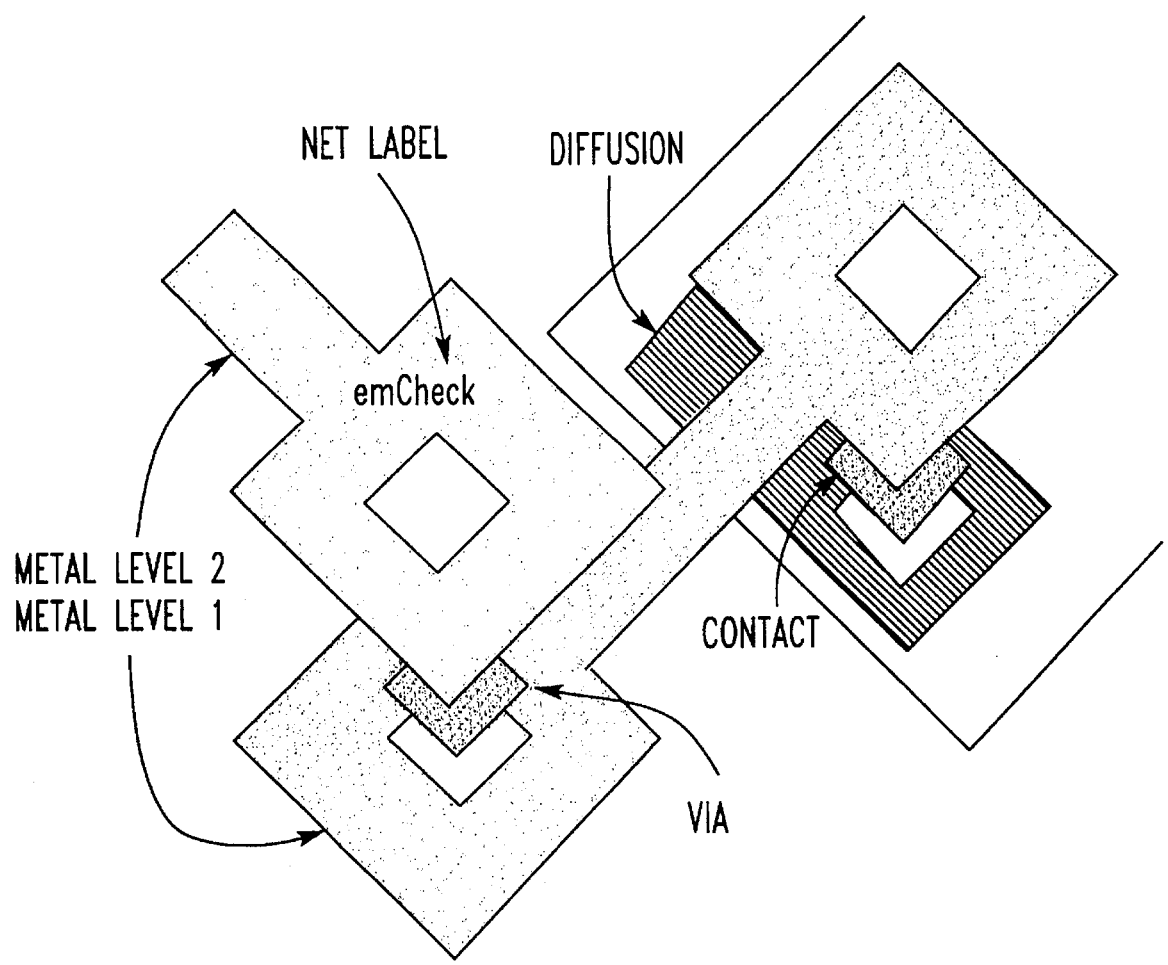
FIG. 20 is a diagrammatical topographic illustration of the effect of the connectivity extraction routine of FIG. 19.

FIG. 19 contains a set of flow listings (Parts 1–4) for deriving connectivity extraction statements that serve to link, by means of a common name identifier or Net label ("emCheck)", each of the component materials of the severed branch obtained in STEP 16. The effect of the connectivity extraction routine of FIG. 19 is diagrammatically illustrated in FIG. 20.

At STEP 1901, the label "emCheck" derived at STEP 719 in FIG. 7 is applied to the cut metal, so as to associate a prescribed 'net' identifier with the branch. At STEP 1902, the true contact material obtained in STEP 1606, described above, is 'connected' with or associated with the cut metal, so that the label of STEP 1901 will propagate throughout all of the contact material lying within the branch. In order to relate the electromigration (em) routine to all the metal within the branch, a STEP 1903 defines the branch em metal as all of the cut metal having or attached to the label "emCheck". Similarly, in order to relate the electromigration (em) routine to all the contact material within the branch, a STEP 1904 defines the branch em contact material as all of the true contact material obtained from STEP 1606 having or attached to the label "emCheck".

Figure 21:
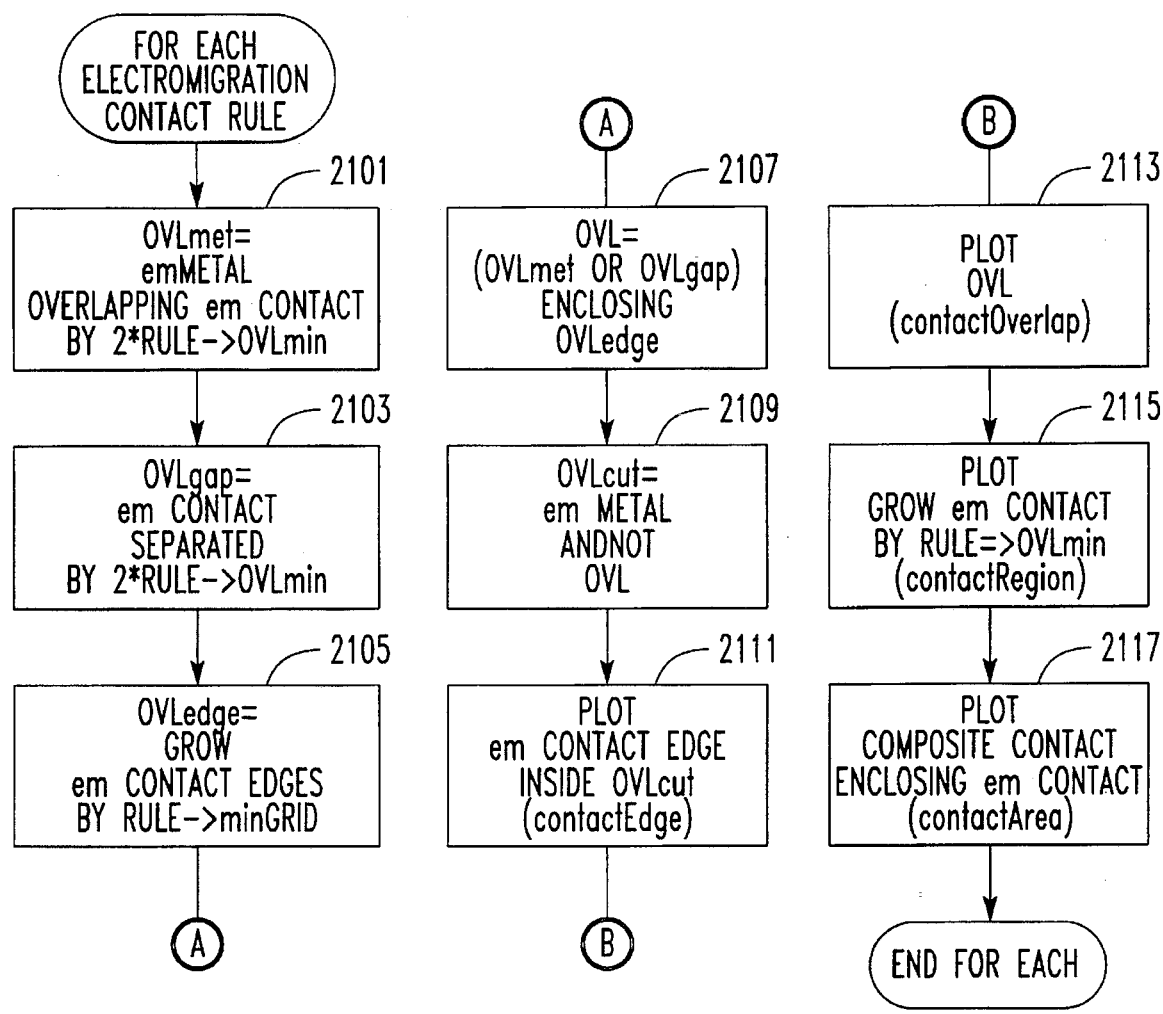
FIG. 21 is a flow diagram of the details of the 'create contact measurement statements' routine of STEP 1503 in FIG. 15.

With all of the component materials (metal and contacts) of the severed branch of interest having been identified in the routine of FIG. 19, the next step in the process, identified as 'create contact measurement statements' at 1503 in FIG. 15, details of which are shown in the flow diagram of FIG. 21, involves examining the differential spacing between the edges of contacts and overlapping metal, and also the separation among adjacent contacts, in order to eliminate from further downstream processing, those edges of a contact/via that are effectively parallel to the direction of current flow and to consider only those edges that are perpendicular to current flow.

Figure 22:
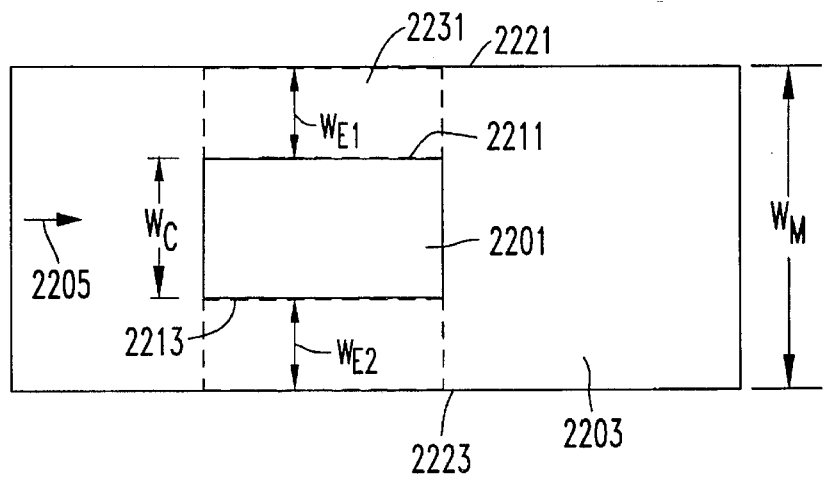
FIGS. 22, 23 and 24 diagrammatically illustrates the effect of the contact measurement routine of FIG. 21 on contact geometries of a topography branch.

The first step of the routine of FIG. 21, shown at STEP 2101, and diagrammatically illustrated in FIG. 22, is to look at the spacing between the side edges of a contact and adjacent metal. FIG. 22 shows a respective contact 2201 and surrounding metal 2203. Contact 2201 has a width W, corresponding to a dimension perpendicular to current flow in the metal in the vicinity of the contact, represented by arrow 2205, and a length L, corresponding to a dimension parallel to current flow. In STEP 2201, the process looks at the degree of overlap of metal 2203 relative to contact 2201 and compares the degree of overlap with a prescribed value, as dictated by topography design rules.

In the above referenced DRC program, the design rule for minimum step coverage requires that metal overlap a contact/via region by some minimum value OVLmin (e.g. five microns). In accordance with the present invention, use is made of this DRC rule to infer the principal direction of current flow relative to the edges of the contact.

In particular, if the degree of overlap is greater than two times the minimum overlap (OVLmin), then it is inferred that the amount of metal alongside the contact is sufficient to effectively reduce the current density on the perpendicular to the side edge of the contact by absorbing some of the current at the sides of the contact. On the other hand, if the degree of overlap is less than or equal to two times the minimum overlap (OVLmin), then it is inferred that sufficient current flows into the edge of the contact perpendicular to the major direction of current flow, so that the dimensions of this edge of the contact must be evaluated in accordance with the electromigration rule set. In this second case, a region of the overlapping metal along the side edge of the contact is generated and labelled as OVLmet. As will be described any contact edge alongside or contiguous with an OVLmet region is excluded from electromigration rule analysis, whereas the dimension of the contact edge orthogonal to the excluded edge is subjected to the minimum required by the electromigration rule.

To determine whether an overlap region OVLmet should be generated, the distance We1 between side edge 2211 of contact 2201 and side edge 2221 of metal layer 2203 is measured; also the distance We2 between side edge 2213 of contact 2201 and side edge 2223 of metal layer 2203 is measured. Each respective distance is compared with two times the above referenced minimum overlap quantity (OVLmin set forth in Table 3). If a respective distance measurement is less than the twice the minimum overlap quantity OVLmin (10 microns, for example), then a respective overlap metal area or region is generated alongside that edge of the contact, and identified as OVLmet. In FIG. 22, respective overlap metal regions are shown in dotted lines 2231 and 2233. The use of these overlap metal regions in the selective exclusion process will be described below.

Figure 23:
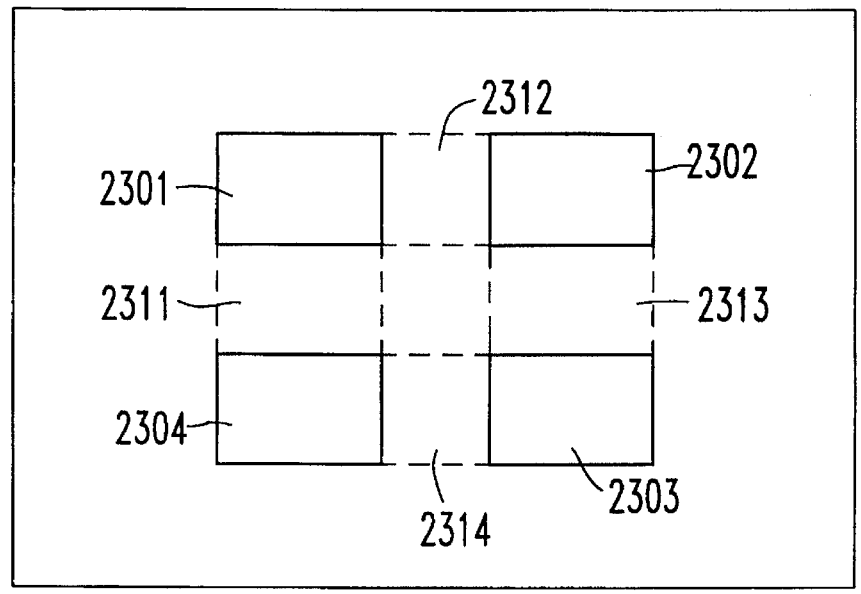

The second step of the routine of FIG. 21, which is similar to STEP 2101, is shown at STEP 2103 and diagrammatically illustrated in FIG. 23, looks at the relative dimensions of gaps between adjacent contacts. FIG. 23 shows a respective set or array of contacts 2301, 2302, 2303 and 2304, and gaps 2311, 2312, 2313, and 2314 thereamong. In STEP 2203, the process looks at the gaps between, or degree of separation of adjacent contacts, and compares the degree of separation with a prescribed value. If the degree of separation is within two times the minimum overlap (OVLmin), referenced above, then a gap, identified as OVLgap, is generated between the contact edges. Thus, in FIG. 23, if the respective separations between each pair of adjacent contacts meet the two times the minimum overlap criterion, a respective minimum overlap gap region OVLgap would be generated at each of gaps 2311, 2312, 2313, and 2314, as shown in dotted lines.

As pointed out above, the purpose of examining the differential spacing between the edges of contacts and overlapping metal (STEP 2101), and the separation among adjacent contacts (STEP 2013), is to eliminate from further downstream processing, those edges of a contact/via that are effectively parallel to the direction of current flow and to consider only those edges that are perpendicular to current flow. Since the DRC process must use area information, rather than pure edges, it is necessary to provide some minimum area to the edges of the contact. For this purpose, the next step of the process (STEP 2105) serves to grow or slightly enlarge each of the edges of a contact of interest by some minimum grid width or thickness, denoted in STEP 2105 as minGrid.

Figure 24:
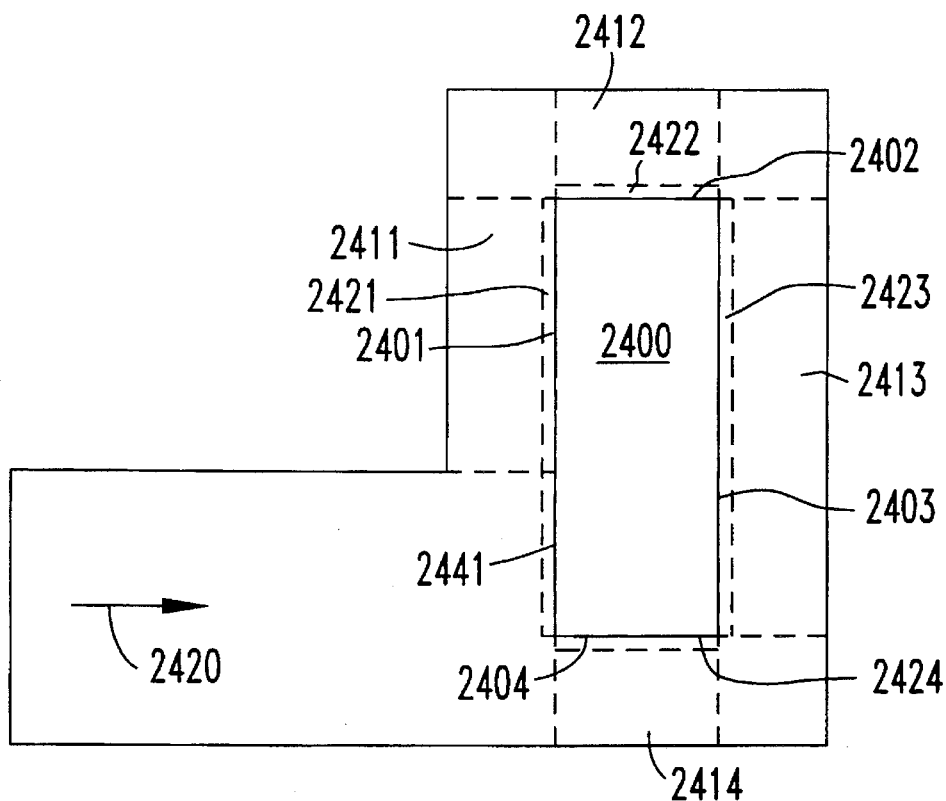

This edge growth is diagrammatically illustrated in FIG. 24 which shows a contact 2400 having side edges 2401, 2402, 2403 and 2404, adjacent to which are respective overlap regions 2411, 2412, 2413 and 2414. In the topography illustration of FIG. 24, the direction of current flow is denoted by arrow 2420, which is orthogonal to edge 2401 of contact 2400. STEP 2105 grows each of edges 2401, 2402, 2403 and 2404 by the minimum grid width to produce a set of four boundary areas 2421, 2422, 2423 and 2424, respectively. Although not shown in FIG. 24, it should also be noted that since STEP 2105 grows the edges of all contacts, some of the edges grown may be those of an array, such as in FIG. 23, which face other contact edges rather than edge of metal.

The next step in the process, shown at STEP 2107 in FIG. 21, examines the overlap metal regions OVLmet (such as regions 2231 and 2233 in FIG. 22, and regions 2411, 2412, 2413 and 2414 in FIG. 24), and overlap gap regions OVLgap (such as regions 2311, 2312, 2313 and 2314 in FIG. 23) to determine whether such overlap regions totally enclose the grown boundary areas. If so, then the corresponding edges of the contact are to be excluded from electromigration analysis. In the example of FIG. 24, therefore, STEP 2107 is operative to label each of edges 2402, 2403 and 2404 as OVL, but not edge 2401, since the lower portion of its associated grown boundary area, shown at 2441, lies outside of OVLmet region 2411.

Next, in STEP 2109, those portions of the interconnect metal that are contiguous with edges of the contact that have been labelled as OVL are labelled as OVLcut, so that they may be excluded from the process. Thus, in the example of FIG. 24, each of overlap metal regions 2412, 2413 and 2414 is labelled as OVLcut. What remains is contact edge 2401 which, as shown, is perpendicular to the direction of current flow 2420. In STEP 2111, this remaining edge is plotted as a contactEdge and stored as such in the database. In the following SEP 2113, the other edges of the contact, previously labelled as OVL in STEP 2107, are plotted as contactOverlap edges.

Figure 25:
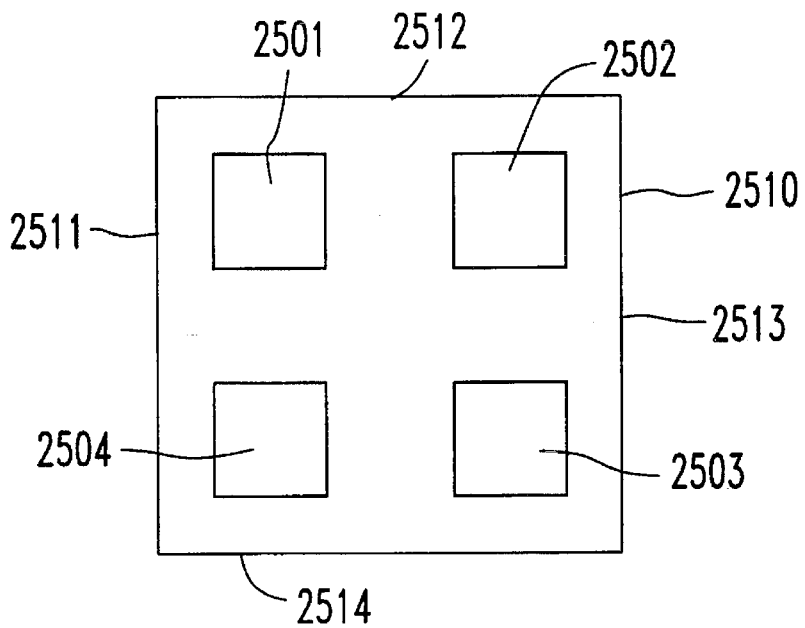
FIG. 25 shows an array of four contacts being grown into a larger area 'contactRegion'.

After plotting the contactEdge perpendicular to current flow (STEP 2111) and the overlap regions OVL (STEP 2113), the routine of FIG. 21 proceeds to grow each of plural ones of contacts that are relatively close together, in particular spaced apart from one another by no more that OVLmin. The magnitude of the growth is OVLmin per edge of the contact. As a result, adjacent contacts that are within an OVLmin separation from one another will effectively grow together and form a single enlarged contact, as shown diagrammatically in FIG. 25, which shows an array of four contacts 2501, 2502, 2503 and 2504 being grown into a larger area contactRegion 2510 having edges 2511, 2512, 2513 and 2514. Finally, in STEP 2117, the 'composite contact' previously defined in STEP 1604 is plotted as contactArea.

Figure 27:
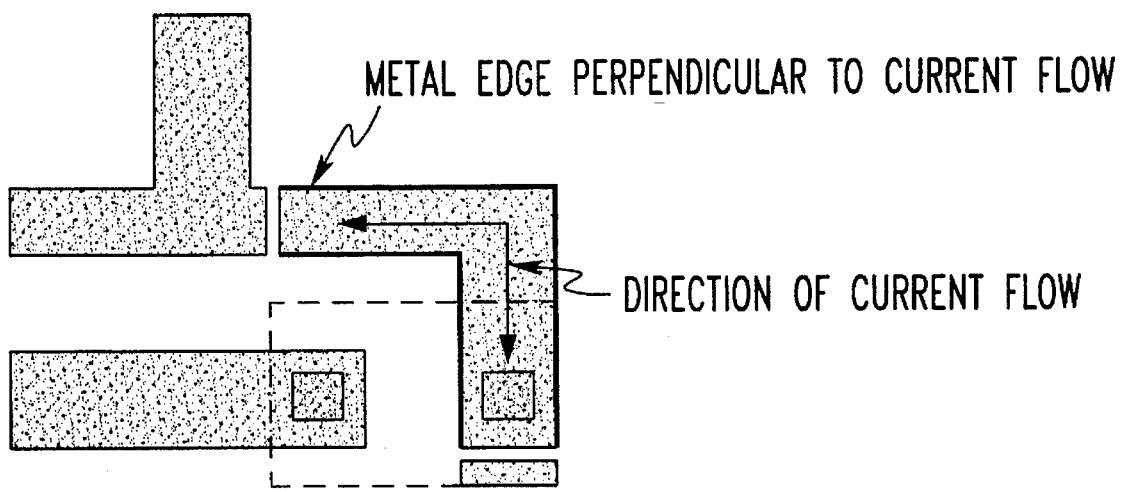
FIG. 27 is a topography branch diagram illustrating the flow routine of FIG. 26.
Figure 26:
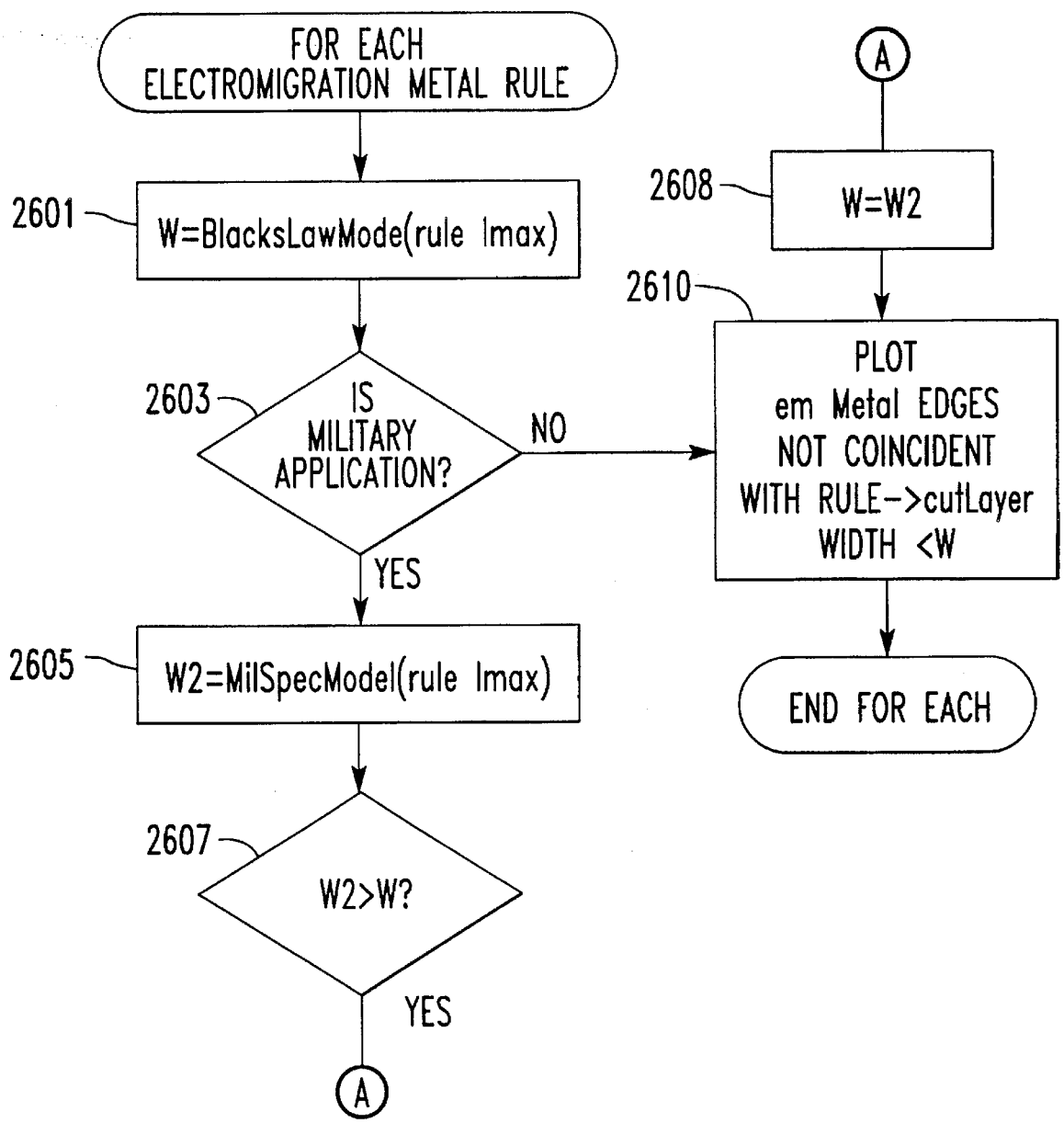
FIG. 26 shows the details of a routine for creating metal verification statements.

Following the creation of contact measurement statements STEP 1503 in FIG. 15 (STEPS 2101–2117, FIG. 21), the process sequence of FIG. 15 proceeds to STEP 1504, to create metal verification statements, details of which are shown in the flow diagram of FIG. 26 and the accompanying topography diagram of FIG. 27. In effect, the creation of metal verification statements routine involves, for each electromigration 'metal' rule, the plotting of those edges of metal of the severed branch or 'cut metal' that are not coincident with the previously cutLayer edges and which have a width less than minimum width for that metal. The electromigration rule set (or model) employed in the process may be a selected one of a plurality of rule sets, for example, the Black's Law Model of Table 1, or a military spec. model (not shown).

In the routine flow of FIG. 26 (STEPS 2601–2610), from whichever of STEPS 2601 (or STEP 2605 in the case of a military spec. application) the largest value of minimum width (W or W2) is produced in accordance with the corresponding electromigration rule set is compared in STEP 2610 with the actual width (separation between the edges) of the metal layer. Wherever the metal width is less than the rule minimum width W, an error value is generated, to be used in the branch measurement routine to be described.

With metal verification statements having been defined the design rule check process now has all of the statements and associated data that it requires to apply the electromigration rules to the geometries of the topography layout and measure the physical dimensions of the branch in the direction perpendicular to current flow against the failure criteria predicted by the electromigration models. The purpose of this last step in the overall process is to graphically create or highlight error regions on the topography branch where electromigration failures will occur. In addition, the values of the dimensional changes required to bring an identified failure feature into compliance with the electromigration rules are specified on the displayed layout.

Figure 28:
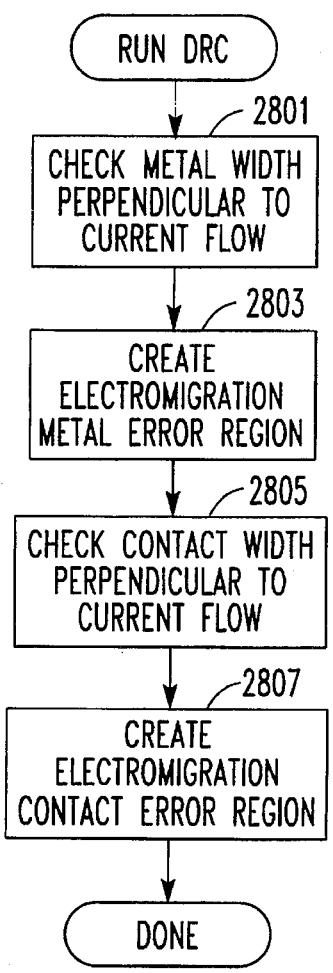
FIG. 28 is a process flow routine for applying electromigration rules to the branch geometries of a circuit topography layout and measuring the physical dimensions of the branch in a direction perpendicular to current flow against the failure criteria predicted by associated electromigration models.
Figure 29:
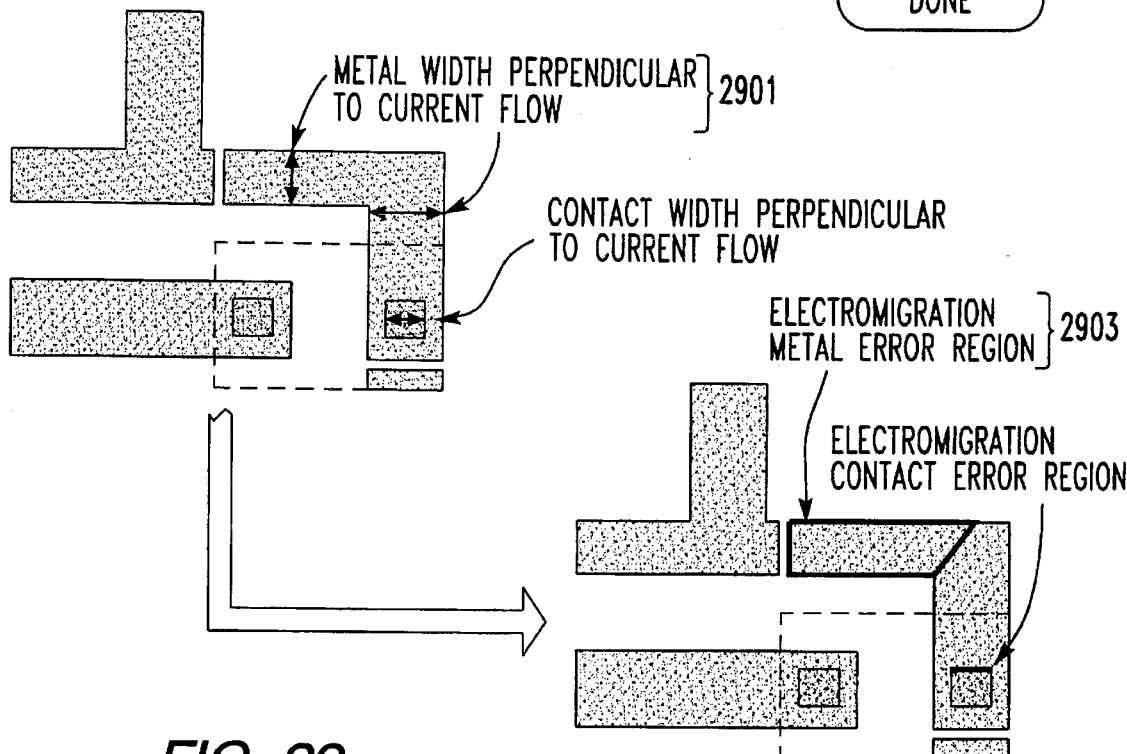
FIG. 29 is a branch topography diagram illustrating the process flow routine of FIG. 28.

Referring now to the process flow routine of FIG. 28 and the accompanying branch topography diagram of FIG. 29, the DRC process is run using the customized statements, such as those set forth in the listing in FIG. 15, described above. At STEP 2801, the metal width perpendicular to the direction of current flow is checked, as shown at 2901 in FIG. 29. Next, in STEP 2803, wherever the metal width being checked has a width that is less than the minimum width required by the electromigration model (e.g. as specified by an error produced at STEP 2610 in the flow routine of FIG. 26, described previously), an electromigration error metal region, in the form of a highlighted boundary region, shown at 2903 in FIG. 29 is generated on the topography layout of the user graphics display device. At STEP 2805, contact measurement attributes assembled in STEP 1503 in the course of creating the contact measurement statements, as detailed in the flow diagram of FIG. 21, are employed to check the contact width perpendicular to current flow in accordance with the contact/via electromigration models set forth in Tables 2 and 3. Wherever the dimension of the contact edge width perpendicular to current flow is less than the minimum width specified by the electromigration rule, that contact edge is highlighted on the display as an error region, at STEP 2807.

Since the error regions that are highlighted on the displayed topography layout are derived from the application of the dimensional parameters of the original layout to the models, the user is also provided with the actual minimum width dimensions required to satisfy the failure criteria dictated by the models. The layout designer is thus able to use this data to interactively modify the dimensions of the layout (including the increasing the dimensions of the highlighted features) to create a revised layout design. Once the revised layout design has been completed, the above process is repeated against the updated layout, to confirm that all dimensions of the metal, contact and via regions of the layout satisfy their associated electromigration models. Should any additional adjustment be necessary, the designer continues to iteratively refine the layout and rerun the program until the branch meets or exceeds all electromigration rule-based minimum dimensional requirements. This process is carried out for all branches of the layout, as specified by the designer, so as to demonstrate that the final overall integrated circuit layout design will satisfy MTF specifications. The circuit is then fabricated in accordance with a verified topography layout.

As will be appreciated from the foregoing description, the present invention provides an 'automated' electromigration rule-based methodology, which is effectively an adjunct to a conventional computer aided design tool, in particular a design rule check (DRC) mechanism, the engine for which is served by a design rule database for defining topography parameters that conform with a given semiconductor wafer fabrication process. With the set of customized design rule statements, the DRC program is able to provide circuit designer with the ability to identify and interactively change, as necessary, dimensions of those portions of branches of interconnect (metal, contacts, vias) within the topography of an integrated circuit layout, the customized DRC statements being customized in accordance with circuit operation-derived worst case current conditions as applied to a prescribed set of electromigration-based minimum width rules for interconnect metal, contacts and vias.

While I have shown and described an embodiment in accordance with the present invention, it is to be understood that the same is not limited thereto but is susceptible to numerous changes and modifications as known to a person skilled in the art, and I therefore do not wish to be limited to the details shown and described herein but intend to cover all such changes and modifications as are obvious to one of ordinary skill in the art.

What is claimed:

1. A method of manufacturing an integrated circuit architecture comprising the steps of:

(a) preparing a preliminary layout of a topography of circuit devices and associated interconnect through which said integrated circuit architecture is to be formed in semiconductor material;

(b) analyzing the operation of said integrated circuit to derive circuit parameters for a selected operational condition in respective branches of said integrated circuit and storing the derived circuit parameters for the respective branches of said integrated circuit;

(c) using circuit parameters derived in step (b), interactively analyzing each respective branch of the topography of said preliminary layout to identify where, within said each respective branch of said topography, a selected characteristic of said each respective branch of said topography fails to satisfy a prescribed operational standard of said integrated circuit and, as said each respective branch is analyzed, storing information representative of respective failures of said selected characteristic to satisfy said prescribed operational standard of said integrated circuit;

(d) interactively modifying, as necessary, said selected characteristic of one or more portions of only that branch or those branches of said topography where step (c) has identified said selected characteristic as failing to satisfy said prescribed operational standard of said integrated circuit, so as to obtain a modified layout of said topography of circuit devices and associated interconnect through which said integrated circuit architecture is to be formed in semiconductor material; and (e) forming said integrated circuit architecture in semiconductor material in accordance with the modified layout of said topography of circuit devices and associated interconnect obtained in step (d), and wherein said circuit parameters derived in step (b) correspond to maximum currents through respective branches of said preliminary layout, and wherein step (c) comprises analyzing the topography of said preliminary layout to identify where, within a branch of said layout, a dimension of any of a metal line, via or contact of said branch fails to be as large as necessary to prevent electromigration in said branch for a current as large as the maximum current through said branch over a prescribed temperature range, and wherein step (c) further comprises analyzing the topography of said preliminary layout in accordance with sets electromigration rules respectively associated with respective ones of metal lines, vias and contacts of which said branches are comprised, and wherein step (c) additionally comprises demarcating a branch of said preliminary layout, and using the maximum branch current associated with the demarcated branch, said set of electromigration rules and the physical topography of the branch, to determine the path of current flow through the branch and electromigration-specific attribute, through which a determination is made as to whether a dimension of one or more portions of metal, bias or contacts within said demarcated branch must be increased, in order to satisfy said prescribed operational standard of said integrated circuit and wherein in step (c), demarcating a branch of said preliminary layout comprises selecting spaced apart end points of said branch, merging successively adjacent portions of interconnect into an effectively continuous layer of interconnect and defining respective cut regions at said spaced apart ends of said branch.

2. A method according to claim 1, wherein, in demarcating a branch of said preliminary layout respective cut region at said spaced apart ends of said branch are defined in accordance with the geometrical configuration of said branch adjacent to said end points.

3. A method of manufacturing an integrated circuit architecture comprising the steps of:

(a) preparing a preliminary layout of a topography of circuit devices and associated interconnect through which said integrated circuit architecture is to be formed in semiconductor material;

(b) analyzing the operation of said integrated circuit to derive circuit parameters for a selected operational condition in respective branches of said integrated circuit and storing the derived circuit parameters for the respective branches of said integrated circuit;

(c) using circuit parameters derived in step (b), interactively analyzing each respective branch of the topography of said preliminary layout to identify where, within said each respective branch of said topography, a selected characteristic of said each respective branch of said topography fails to satisfy a prescribed operational standard of said integrated circuit and, as said each respective branch is analyzed, storing information representative of respective failures of said selected characteristic to satisfy said prescribed operational standard of said integrated circuit;

(d) interactively modifying, as necessary, said selected characteristic of one or more portions of only that branch or those branches of said topography where step (c) has identified said selected characteristic as failing to satisfy said prescribed operational standard of said integrated circuit, so as to obtain a modified layout of said topography of circuit devices and associated interconnect through which said integrated circuit architecture is to be formed in semiconductor material; and (e) forming said integrated circuit architecture in semiconductor material in accordance with the modified layout of said topography of circuit devices and associated interconnect obtained in step (d), and wherein said circuit parameters derived in step (b) correspond to maximum currents through respective branches of said preliminary layout, and wherein step (c) comprises analyzing the topography of said preliminary layout to identify where, within a branch of said layout, a dimension of any of a metal line, via or contact of said branch fails to be as large as necessary to prevent electromigration in said branch for a current as large as the maximum current through said branch over a prescribed temperature range, and wherein step (c) further comprises analyzing the topography of said preliminary layout in accordance with sets of electromigration rules respectively associated with respective ones of metal lines, vias and contacts of which said branches are comprises, and wherein step (c) additionally comprises demarcating a branch of said preliminary layout, and using the maximum branch current associated with the demarcated branch, said set of electromigration rules and the physical topography of the branch, to determine the path of current flow through the branch and electromigration-specific attributes, through which a determination is made as to whether a dimension of one or more portions of metal, bias or contacts within said demarcated branch must be increased, in order to satisfy said prescribed operational standard of said integrated circuit and wherein step (c) further comprises defining a set of cut regions at spaced apart end points of said branch, between which cut regions said branch is extracted from said topography, defining geometrical attributes of respective interconnect portions of which said extracted branch is comprised in accordance with electromigration rules respectively associated with materials of said respective interconnect portions, measuring attributes of contacts within said extracted branch, and determining the direction of current flow through said branch.

4. A method of manufacturing an integrated circuit architecture comprising the steps of:

(a) preparing a preliminary layout of a topography of circuit devices and associated interconnect material through which said integrated circuit architecture is formed in a semiconductor material;

(b) analyzing the operation of said integrated circuit to derive circuit parameters for a selected operational condition in respective branches of said integrated circuit and storing the derived circuit parameters for the respective branches of said integrated circuit;

(c) demarcating the topography of each branch of the circuit layout and, using circuit parameters derived in step (b), setting the maximum current through said each branch of the demarcated topography;

(d) compiling and storing a set of customized Design Rule Check (DRC) statements that are customized in accordance with said demarcated topography of said each branch, the maximum current through said each branch, and electromigration rules for respective interconnect materials of which said each branch is comprised (e) executing a design rule check process using the customized DRC statements compiled and stored in step (d), in order to determine the width of interconnect material perpendicular to the direction of current flow, and generating an electromigration error region on a plot of said demarcated topography of said each branch, in response to interconnect material having a width less than the minimum width required by an electromigration rule set;

(f) interactively modifying dimensions of said demarcated topography of only that branch or those branches for which said electromigration error region has been generated in step (e) so as to create a modified layout in which dimensions of associated interconnect, containing metal, contact and via regions, satisfy associated electromigration rule sets; and (g) forming said integrated circuit architecture in said semiconductor material in accordance with the interactively modified layout of said topography of circuit devices and associated interconnect created in step (f).

5. A method according to claim 4, wherein demarcating the topography of a branch of the circuit layout in step (c) comprises designating respective locations at opposite ends of said branch, so as to place end boundaries of said branch and cut regions that enable said branch to be separated from the remainder of the interconnect material of the circuit topography.

6. A method according to claim 5, wherein step (c) comprises, for a selected end point, identifying interconnect material directly beneath coordinates of the end point to establish a 'data' layer of the identified interconnect material, and merging multiple interconnect media that overlap or abut one another in the vicinity of the selected end point, so as to define a continuum of interconnect material, and generating an electromigration rule associated with the interconnect material that has been denoted as the data layer beneath the end point.

7. A method according to claim 6, wherein step (c) further comprises selecting an arbitrary point on said branch between end points of said branch, identifying the type of interconnect material directly beneath said arbitrary point, specifying the electromigration rule associated with the identified type of material and creating, from an associated material parameter list, a label to identify a composite set of materials of which said branch is formed.

8. A method according to claim 5, wherein step (d) comprises creating cut statements for metal and for identifying all contact material that resides within the branch of interest, through the execution of which cut statements the branch is severed from the remainder of the interconnect topography.

9. A method according to claim 8, wherein step (d) comprises generating cut statements for metal by logically combining all metals in electromigration parameter listings that correspond to the demarcated branch into a composite metal layer and excluding from the composite metal layer that portion of the interconnect metal corresponding to the cut regions.

10. A method according to claim 9, wherein step (d) further comprises creating cut statements for identifying all of the contact material that resides with said branch of interest by combining all of the contact material of a respective layer into composite contact material, and logically combining the composite contact material with contact material within said branch of interest.

11. A method according to claim 10, wherein step (d) further comprises generating connectivity extraction statements that serve to link each material of which the severed branch is comprised.

12. A method according to claim 11, wherein step (d) further comprises creating contact measurement statements by examining the differential spacing between the edges of contacts and overlapping metal, and the separation among adjacent contacts, in order to eliminate those edges of a contact or via that are effectively parallel to the direction of current flow and to employ only edges that are perpendicular to current flow.

13. A method according to claim 12, wherein step (d) comprises examining the degree of overlap of metal relative to contact material and comparing the degree of overlap with a prescribed value, as dictated by topography design rules to establish the principal direction of current flow relative to the edges of the contact.

14. A method according to claim 13, wherein step (d) comprises, in response to said degree of overlap being greater than a prescribed multiple of minimum overlap, establishing that the amount of metal alongside the contact is sufficient to cause most of the current flowing in the vicinity of the contact to be parallel to the major direction of current flow along the metal approaching the contact and, in response to the degree of overlap being less than or equal to said prescribed multiple of minimum overlap, establishing that sufficient current flows into the edge of the contact perpendicular to the major direction of current flow, so that the dimensions of the edge of the contact must be evaluated in accordance with an electromigration rule set.

15. A method according to claim 14, wherein step (d) comprises, in response to the degree of overlap being less than or equal to said prescribed multiple of minimum overlap, generating a region of the overlapping metal along the side edge of the contact as overlap metal, and excluding any contact edge contiguous with an overlapping region from electromigration rule analysis, while subjecting the dimension of the contact edge orthogonal to the excluded edge to a minimum dimension required by the associated electromigration rule.

16. A method according to claim 15, wherein step (d) further comprises growing edges of a respective contact by a prescribed minimum grid width to produce a set of boundary areas and, in response to overlap regions totally enclosing said grown boundary areas, excluding the corresponding edges of a respective contact from electromigration analysis, and excluding those portions of interconnect metal that are contiguous with edges of the contact, so as to leave a contact edge which is perpendicular to the direction of current flow.

17. A method according to claim 16, wherein step (d) further comprises growing each of a plurality of contacts that are spaced apart from one another by no more than a prescribed minimum overlap as specified in associated electromigration models, so that adjacent contacts that are within a minimum overlap separation from one another will effectively grow together and form a single enlarged contact.

18. A method according to claim 11, wherein step (d) further comprises creating metal verification statements based upon plotting edges of metal of the severed branch that are not coincident with previously cut metal layer edges and which have a width less than minimum metal width for said of the metal severed branch and generating an indication of the degree of error in width of said metal from minimum metal width.

19. A method according to claim 18, wherein step (e) comprises executing said design rule check process using the customized DRC statements compiled in step (d), and thereby determining the width of interconnect material perpendicular to the direction of current flow, and generating electromigration error regions on a plot of said demarcated branch, in response to interconnect material having a width less than the minimum width required by an associated electromigration model, and graphically highlighting error regions at those locations of the topography branch where electromigration failures will occur.

20. A method according to claim 19, wherein step (f) comprises modifying, as necessary, one or more portions of each branch of said topography where step (e) has highlighted locations of said each branch as failing to satisfy a prescribed operational standard of said integrated circuit, so as to obtain a modified layout of said topography of circuit devices and associated interconnect through which said integrated circuit architecture is formed in semiconductor material.

21. A method of manufacturing an integrated circuit architecture comprising the steps of:

(a) generating an integrated circuit architecture topography layout of circuit devices and associated interconnect material through which said circuit devices are to be interconnected to implement a circuit to be manufactured;

(b) simulating the operation of said circuit in accordance with varying circuit operating conditions, so as to produce, for respective branches of said circuit, values of circuit parameters that result from said varying circuit operating conditions;

(c) storing the values of circuit parameters produced in step (b);

(d) comparing the values of circuit parameters stored in step (c) with design values of said circuit parameters;

(e) specifying values of circuit parameters for each branch of said circuit based upon step (d);

(f) for respective branches of said integrated circuit architecture topography layout, generating respective customized design rule check statements in accordance with:

1) physical attributes of said respective branches of said integrated circuit architecture topography layout,
2) values of circuit parameters for said respective branches of said integrated circuit architecture topography layout specified in step (e), and
3) electromigration rules for interconnect material in said respective branches of said integrated circuit architecture topography layout;

(g) subjecting said integrated circuit architecture topography layout to a design rule check routine executed in accordance with the customized design rule check statements generated in step (f);

(h) displaying said integrated circuit architecture topography layout;

(i) demarcating regions of said integrated circuit architecture topography layout displayed in step (h) where execution of said design rule check routine in step (g) has determined that said integrated circuit architecture topography layout fails to comply with said electromigration rules;

(j) interactively adjusting aspects of branches of said integrated circuit architecture topography layout containing regions demarcated in step (i), so as to produce a modified version of said integrated circuit architecture topography layout in which branches containing said regions demarcated in step (i) do not fail to comply with said electromigration rules; and (k) forming said modified version of said integrated circuit architecture topography layout derived in step (l) in semiconductor material.

22. A method according to claim 21, wherein step (k) comprises repeating steps (b)–(j), as necessary, to derive a finalized version of said integrated circuit architecture topography layout in which every branch thereof complies with said electromigration rules, and forming said finalized version of said integrated circuit architecture topography in semiconductor material.

23. A method according to claim 22, wherein step (b) comprises simulating the operation of said circuit in accordance with varying circuit operating conditions, so as to produce, for respective branches of said circuit, values of maximum current that result from said varying circuit operating conditions.

24. A method according to claim 23, wherein step (j) comprises interactively adjusting dimensions of one or more portions of branches of said integrated circuit architecture topography so as to produce a modified version of said integrated circuit architecture topography layout which does not fail to comply with said electromigration rules at said regions demarcated in step (i).

25. A method according to claim 24, wherein step (c) comprises storing the values of maximum currents produced in step (b), step (d) comprises comparing the values of maximum currents stored in step (c) with maximum design current values, and step (e) comprises specifying a value of maximum current for each branch of said circuit as the larger of maximum current stored in step (c) and the maximum design current value for said each branch.

* * * * *